(12) United States Patent
Hollis et al.

(10) Patent No.: US 10,283,187 B2
(45) Date of Patent: May 7, 2019

(54) APPARATUSES AND METHODS FOR PROVIDING ADDITIONAL DRIVE TO MULTILEVEL SIGNALS REPRESENTING DATA

(71) Applicant: MICRON TECHNOLOGY, INC., Boise, ID (US)

(72) Inventors: Timothy M. Hollis, Meridian, ID (US); Dragos Dimitriu, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 15/783,688

(22) Filed: Oct. 13, 2017

(65) Prior Publication Data

US 2019/0027205 A1  Jan. 24, 2019

Related U.S. Application Data

(60) Provisional application No. 62/534,436, filed on Jul. 19, 2017.

(51) Int. Cl.
*G11C 7/22* (2006.01)
*G11C 11/4074* (2006.01)
*G11C 11/4076* (2006.01)

(52) U.S. Cl.
CPC ............ *G11C 11/4074* (2013.01); *G11C 7/22* (2013.01); *G11C 11/4076* (2013.01)

(58) Field of Classification Search
CPC .................................. G11C 11/404; G11C 7/22
(Continued)

(56) References Cited

U.S. PATENT DOCUMENTS 5,166,956 A  11/1992  Baltus et al.
5,446,697 A * 8/1995  Yoo ......................... G11C 5/145
                                                    365/189.07
(Continued)

FOREIGN PATENT DOCUMENTS

CN  105247791 A  1/2016
TW  I343058 B1  6/2011
(Continued)

OTHER PUBLICATIONS

Avci, et al., "A Novel Compact Circuit for 4-PAM Energy-Efficient High Speed Interconnect Data Transmission and Reception", Microelectron Journal, vol. 36, No. 1, pp. 67-75, Jan. 2005.
(Continued)

*Primary Examiner* — Michael T Tran
(74) *Attorney, Agent, or Firm* — Dorsey & Whitney LLP

(57) ABSTRACT

Apparatuses and methods for providing additional drive to multilevel signals representing data are described. An example apparatus includes a first driver section, a second driver section, and a third driver section. The first driver section is configured to drive an output terminal toward a first selected one of a first voltage and a second voltage. The second driver section configured to drive the output terminal toward a second selected one of the first voltage and the second voltage. The third driver section configured to drive the output terminal toward the first voltage when each of the first selected one and the second selected one is the first voltage. The third driver circuit is further configured to be in a high impedance state when the first selected one and the second selected one are different from each other.

15 Claims, 15 Drawing Sheets

(58) Field of Classification Search
USPC .......................................... 365/174, 189.05
See application file for complete search history.

(56) References Cited

U.S. PATENT DOCUMENTS

| | | | |
|---|---|---|---|
| 5,471,156 A | 11/1995 | Kim et al. | |
| 5,770,967 A * | 6/1998 | Alzati | H03K 17/063 |
| | | | 327/365 |
| 5,856,980 A | 1/1999 | Doyle | |
| 5,917,340 A | 6/1999 | Manohar et al. | |
| 6,140,841 A | 10/2000 | Suh | |
| 6,208,575 B1 * | 3/2001 | Proebsting | G11C 7/065 |
| | | | 257/E21.659 |
| 6,324,602 B1 | 11/2001 | Chen et al. | |
| 6,518,893 B1 | 2/2003 | Robinson | |
| 6,745,316 B1 | 6/2004 | Yang | |
| 7,224,737 B2 | 5/2007 | Voutilainen | |
| 7,263,148 B2 | 8/2007 | Chang et al. | |
| 8,026,740 B2 | 9/2011 | Hollis | |
| 8,363,707 B2 | 1/2013 | Hollis | |
| 8,436,653 B2 | 5/2013 | Hollis | |
| 8,594,262 B2 | 11/2013 | Slezak et al. | |
| 8,737,456 B2 | 5/2014 | Hollis | |
| 8,781,022 B1 | 7/2014 | Chang et al. | |
| 8,854,236 B2 | 10/2014 | Hollis | |
| 9,112,550 B1 | 8/2015 | Ulrich | |
| 9,116,828 B2 | 8/2015 | Hollis | |
| 9,263,107 B1 | 2/2016 | Wayland et al. | |
| 9,464,918 B2 | 10/2016 | Klode et al. | |
| 9,831,873 B2 | 11/2017 | Stoica et al. | |
| 9,917,711 B2 | 3/2018 | Ulrich | |
| 9,979,354 B2 | 5/2018 | Høyerby | |
| 2002/0084833 A1 * | 7/2002 | Kim | H02M 3/073 |
| | | | 327/536 |
| 2003/0156101 A1 * | 8/2003 | LeChevalier | G09G 3/3216 |
| | | | 345/204 |
| 2003/0205974 A1 * | 11/2003 | Kuehner | F02N 11/04 |
| | | | 318/400.17 |
| 2003/0214347 A1 * | 11/2003 | Nuzzarello | G11C 5/145 |
| | | | 327/536 |
| 2004/0066225 A1 * | 4/2004 | Seo | H02M 3/073 |
| | | | 327/536 |
| 2004/0110519 A1 | 6/2004 | Chang et al. | |
| 2004/0207329 A1 * | 10/2004 | Kudo | G06F 1/3203 |
| | | | 315/167 |
| 2005/0078712 A1 | 4/2005 | Voutilainen | |
| 2005/0220232 A1 | 10/2005 | Kunnari et al. | |
| 2007/0183205 A1 * | 8/2007 | Lee | G11C 16/30 |
| | | | 365/185.18 |
| 2008/0068070 A1 * | 3/2008 | Lee | G11C 5/14 |
| | | | 327/536 |
| 2008/0150620 A1 * | 6/2008 | Lesso | H02M 3/07 |
| | | | 327/536 |
| 2008/0304335 A1 * | 12/2008 | Shin | G11C 5/145 |
| | | | 365/189.07 |
| 2009/0059712 A1 | 3/2009 | Lee et al. | |
| 2009/0122593 A1 * | 5/2009 | Cho | G11C 8/08 |
| | | | 365/148 |
| 2009/0167425 A1 * | 7/2009 | Park | G05F 3/205 |
| | | | 327/548 |
| 2009/0184239 A1 * | 7/2009 | Jeong | G01J 1/44 |
| | | | 250/214 R |
| 2009/0238300 A1 | 9/2009 | Hollis | |
| 2009/0273362 A1 | 11/2009 | Fairbanks | |
| 2009/0313521 A1 | 12/2009 | Hollis | |
| 2010/0026533 A1 | 2/2010 | Hollis | |
| 2010/0289556 A1 * | 11/2010 | Byeon | G05F 1/575 |
| | | | 327/536 |
| 2011/0001534 A1 * | 1/2011 | Chuang | G09G 3/3696 |
| | | | 327/200 |
| 2011/0012521 A1 * | 1/2011 | Byun | G09G 3/3406 |
| | | | 315/186 |
| 2011/0012671 A1 * | 1/2011 | Chuang | H02M 3/07 |
| | | | 327/536 |
| 2011/0102208 A1 | 5/2011 | Terashima | |
| 2011/0316618 A1 * | 12/2011 | Bergler | H02M 3/073 |
| | | | 327/536 |
| 2012/0249636 A1 * | 10/2012 | Kitabayashi | B41J 2/04506 |
| | | | 347/10 |
| 2013/0043900 A1 | 2/2013 | Hollis et al. | |
| 2013/0278296 A1 | 10/2013 | Amirkhany et al. | |
| 2013/0301750 A1 | 11/2013 | Chang et al. | |
| 2014/0101349 A1 * | 4/2014 | Engl | G06F 13/4072 |
| | | | 710/104 |
| 2014/0269140 A1 * | 9/2014 | Sanjeevarao | G11C 8/08 |
| | | | 365/230.06 |
| 2014/0297986 A1 * | 10/2014 | Lee | G11C 11/401 |
| | | | 711/167 |
| 2014/0313836 A1 * | 10/2014 | Pan | G11C 5/148 |
| | | | 365/185.23 |
| 2015/0002408 A1 | 1/2015 | Mozak et al. | |
| 2015/0022383 A1 | 1/2015 | Hollis | |
| 2015/0061738 A1 * | 3/2015 | Kwon | H02M 3/073 |
| | | | 327/157 |
| 2015/0097598 A1 | 4/2015 | Cronin | |
| 2015/0171836 A1 * | 6/2015 | Lee | H03K 5/1565 |
| | | | 327/175 |
| 2015/0177754 A1 * | 6/2015 | Mengad | G05F 1/56 |
| | | | 323/280 |
| 2015/0187441 A1 | 7/2015 | Hollis | |
| 2015/0345993 A1 | 12/2015 | Klode et al. | |
| 2016/0065211 A1 | 3/2016 | Hsu | |
| 2016/0087633 A1 * | 3/2016 | Zhang | H03K 19/018578 |
| | | | 327/109 |
| 2016/0094224 A1 * | 3/2016 | Tamura | H03K 19/0013 |
| | | | 326/102 |
| 2016/0308533 A1 * | 10/2016 | Hsu | H03K 19/018521 |
| 2016/0363461 A1 | 12/2016 | Klode et al. | |
| 2017/0039981 A1 * | 2/2017 | Hwang | G09G 3/3696 |
| 2017/0062055 A1 * | 3/2017 | Polizzi | G11C 16/10 |
| 2017/0131327 A1 * | 5/2017 | Ullmann | G01R 1/30 |
| 2017/0212695 A1 | 7/2017 | Hollis et al. | |
| 2017/0365331 A1 * | 12/2017 | Chanana | G11C 11/419 |
| 2018/0006643 A1 * | 1/2018 | Schulmeyer | H03K 17/0822 |
| 2018/0053558 A1 * | 2/2018 | Tanzawa | G11C 16/30 |
| 2018/0109255 A1 * | 4/2018 | Lee | H03K 17/6872 |
| 2018/0123451 A1 * | 5/2018 | Larsen | H02M 1/14 |
| 2018/0145681 A1 * | 5/2018 | Foley | H03K 17/567 |

FOREIGN PATENT DOCUMENTS

| | | |
|---|---|---|
| TW | 201411636 A | 3/2014 |
| WO | 2017127222 A1 | 7/2017 |

OTHER PUBLICATIONS

Farzan, et al., "A Low-Complexity Power-Efficient Signaling Scheme for Chip-To-Chip Communication", IEEE, May 2003.

Koob, et al., "Design and Characterization of a Multilevel DRAM", IEEE Transactions on Very Large Scale Integration (VLSI) Systems, vol. 19, No. 9, Sep. 2011.

Liu, et al., "A Multi-Level DRAM with Fast Read and Low Power Consumption", IEEE, Apr. 2005.

Rokhani, et al., "Low-Power Bus Transform Coding for Multilevel Signals", IEEE, Dec. 2006.

Svensson, et al., "A 3-Level Asynchronous Protocol for a Differential Two-Wire Communication Link", IEEE Journal of Solid-State Circuits. vol. 29. No. 9, Sep. 1994.

U.S. Appl. No. 15/004,777, filed Jan. 22, 2016, entitled "Apparatuses and Methods for Encoding and Decoding of Signal Lines for Multi-Level Communication Architectures".

International Search Report and Written Opinion dated Oct. 29, 2018 for PCT Application No. PCT/US2018/042698, 16 pages.

Byun, et al., "A Low-Power 4-PAM Transceiver Using a Dual-Sampling Technique for Heterogeneous Latency-Sensitive Network-on-Chip" IEEE Transactions On Circuits and System—11: Express Briefs, vol. 62, No. 6, Jun. 2015.

Quadir, et al., "A 56Gb/s PAM-4 VCSEL driver circuit". ISSC 2012, NUI Maynooth, Jun. 2012. pp. all.

(56) References Cited

OTHER PUBLICATIONS

Rokhani, "Low Power Design of Bus Communication" dissertation by Fakhrul Zaman Rokhani, Nov. 2008.
Song, et al., "A 0.18-μm CMOS 10-Gb/s Dual-Mode 10-PAM Serial Link Transceiver", IEEE Transactions on Circuits and Systems—1: Regular Papers, vol. 60, No. 2, Feb. 2013. pp. all.

* cited by examiner

APPARATUSES AND METHODS FOR PROVIDING ADDITIONAL DRIVE TO MULTILEVEL SIGNALS REPRESENTING DATA

CROSS-REFERENCE TO RELATED APPLICATION

This application claims the filing benefit of U.S. Provisional Application No. 62/534,436, filed Jul. 19, 2017. This application is incorporated by reference herein in its entirety and for all purposes.

BACKGROUND

The pursuit of making computing systems more faster and more power efficient has led to advancement in interface communications to improve throughput without increasing, while ideally reducing, energy consumption. Often, as clock speeds increase, a desire to increase data transition times on interface busses to match the faster clock speeds exists. Future double data rate (DDR) dynamic random-access memory (DRAM) performance targets will soon exceed DRAM transistor switching capabilities.

Although not observed in the context of memory systems, some computing systems have implemented multi-level (e.g., more than two levels) signaling architectures to increase throughput over an interface bus. However, a challenge with multilevel signaling in high speed, high bandwidth, low power memory systems is non-idealities that negatively affect system performance, for example, with regards to signal voltage levels and signal voltage margins. An example is the inability of signal drivers to fully drive the voltage levels of the multilevel signals to a high supply voltage or to a low supply voltage within a data period due to non-ideal performance of the circuits (e.g., pull-up and pull-down transistors) of the signal drivers. Variations in power, temperature, and fabrication process may further degrade system performance. As a result, the voltage range for the multilevel signals is reduced, which decreases the voltage margins for the different voltage levels. More generally, the signal drivers may be unable to adequately drive the multilevel signals to the correct voltage levels, which may result in data errors.

DETAILED DESCRIPTION

Certain details are set forth below to provide a sufficient understanding of examples of the disclosure. However, it will be clear to one having skill in the art that examples of the disclosure may be practiced without these particular details. Moreover, the particular examples of the present disclosure described herein should not be construed to limit the scope of the disclosure to these particular examples. In other instances, well-known circuits, control signals, timing protocols, and software operations have not been shown in detail in order to avoid unnecessarily obscuring the disclosure. Additionally, terms such as "couples" and "coupled" mean that two components may be directly or indirectly electrically coupled. Indirectly coupled may imply that two components are coupled through one or more intermediate components.

Figure 1:
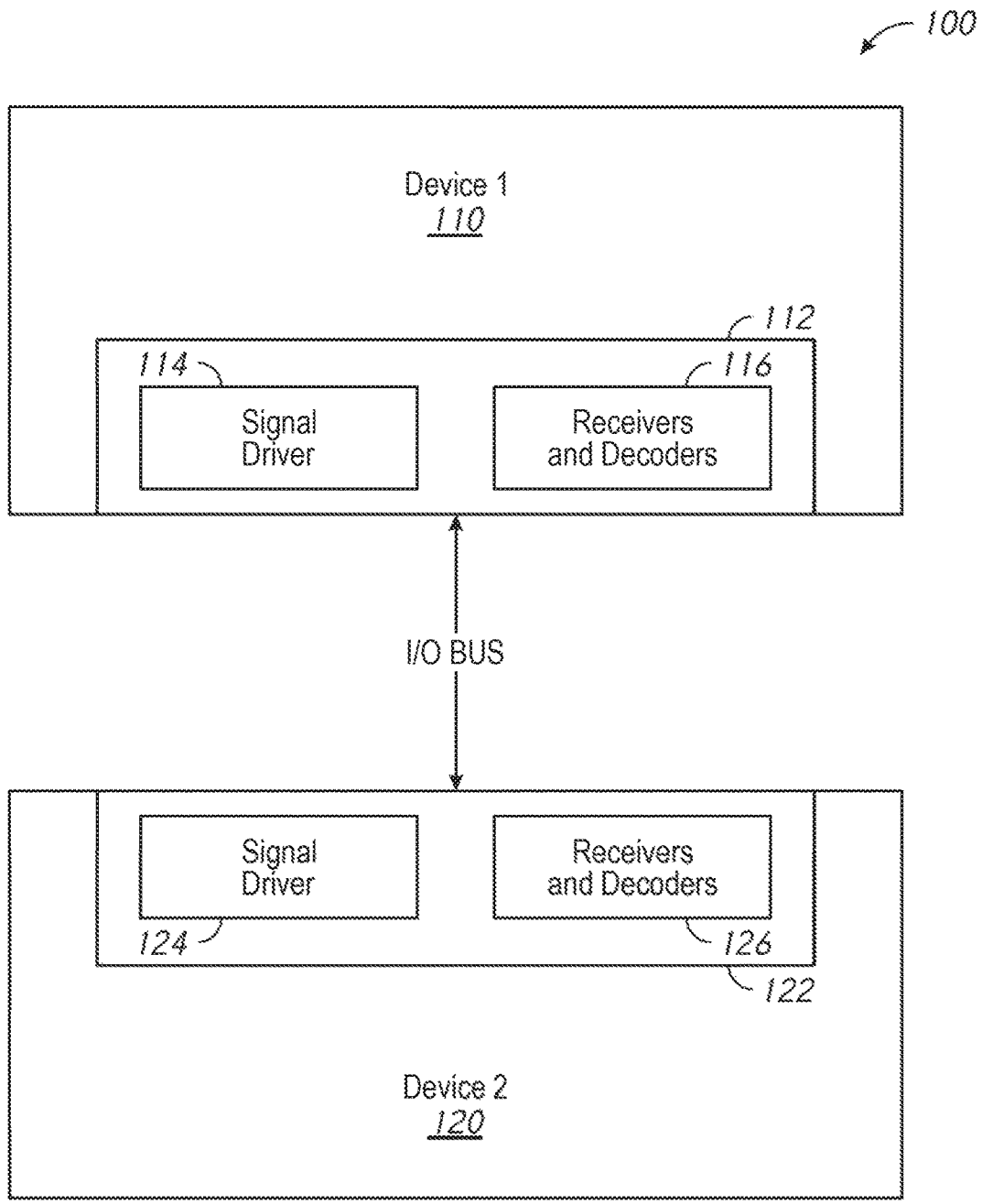
FIG. 1 is a block diagram of an apparatus according to an embodiment of the present disclosure.

FIG. 1 is a block diagram of an apparatus 100 according to an embodiment of the present disclosure. The apparatus 100 may include a first device 110 that communicates with a second device 120 over an input/output (I/O) bus. The first device 110 may include an I/O interface circuit 112 that includes signal driver 114 and receiver and decoder circuit 116 for communication over the I/O bus. The second device 120 may include an I/O interface circuit 122 that includes signal driver 124 and receiver and decoder circuit 126 for communication over the I/O bus. The I/O bus may support a multilevel communication architecture that includes a plurality of channels. In some embodiments, each channel may be single-ended and may include a single signal line. In other embodiments, each channel may include more than one signal line. In one embodiment, the first device 110, the second device 120, and the I/O bus may support a channel that includes conversion of M bitstreams to N multilevel signals, where M is greater than N.

A bitstream includes a plurality of bits provided serially, wherein each bit of the bitstreams is provided over a period of time that may be referred to as a data period. For example, a first bit is provided for a first period, and a second bit is provided for a second period following the first period, and a third bit is provided for a third period following the second period, and so on. The successive bits provided in this serial manner represent a stream of bits. The corresponding bits of each bitstream for a data period represents data M bits wide. A multilevel signal may have one of three or more voltage levels (in contrast to binary signals which may have one of two voltage levels to represent a data value), where the voltage level of the multilevel signal represents a data value. The N multilevel signals may be transmitted over the I/O bus. Each multilevel signal is provided over a data period having a voltage corresponding to one of multiple voltage levels (e.g., 2 different voltage levels, 4 different voltage levels, 8 different voltage levels, etc.), where each of the multiple voltage levels represents different data. In one example, 3 bit streams may be converted to 2 tri-level signals. In another example, pulse-amplitude modulation (PAM) may be used to convert 2, 3, or 4 bitstreams into a single multilevel signal having 4, 8, 16, etc., levels.

For example, in a conventional memory device having 8 input/output (I/O) terminals, total of 64 bits of data can be accessed (e.g., read or written) in a column operation. That is, each of 8 I/O terminals may be provided with 8 bits of serialized data, resulting in a total of 64 bits of data (e.g., 8 I/O terminals multiplied by 8 bits (in serial) per I/O terminal). In the conventional memory device, a set of 8 bits of data is converted in series using a first-in, first-out (FIFO) circuit coupled with well-known time multiplexing methods because there are 8 I/O terminals (not 64). In an embodiment of the disclosure, for example, where 2 bits are converted to a multilevel signal (e.g., having one of four different voltage levels to represent the 2 bit value), the 8 serialized data can be converted into 4 serialized data, or 8 I/O terminals can be reduced to 4 I/O terminals (where each of the 4 I/O terminals is provided with 8 bits of serialized data).

In some examples, the first device 110 may include a memory controller or processing system and/or the second device 120 may include a memory, including volatile memory and/or non-volatile memory. In some examples, the second device 120 may include a dynamic random access memory (DRAM), such as a double-data-rate (DDR) DRAM or a low power DDR DRAM. It should be noted, however, that a memory is not a necessary component of the disclosure. Rather, the disclosure may be applied to any two or more devices, on or off-chip, that communicate with one another using multilevel signaling.

The signal driver 114 may include circuitry that applies a bitstream conversion to a set of M bitstreams to generate N multilevel signals and drives the N multilevel signals onto channels of the I/O bus. Similarly, the signal driver 124 may include circuitry that applies a bitstream conversion to a set of M bitstreams to generate N multilevel signals and drives the N multilevel signals onto channels of the I/O bus. In some examples, the signal driver 114 may include modifications to existing DDR drivers to drive the multilevel signals onto the channels of the I/O bus. The M bitstreams may be converted into the N multilevel signals using various techniques now known or later developed. For example, in some embodiments of the disclosure, a PAM4 technique may be used to convert two-bit data into a multilevel signal having one of four different voltage levels. In other embodiments of the disclosure, a PAM8 technique may be used to convert three-bit data into a multilevel signal having one of eight different voltage levels. Other conversion techniques may be used as well without departing from the scope of the disclosure.

For each channel, the receiver and decoder circuit 116 may include decoders configured to recover the set of M bitstreams by decoding the N multilevel signals received via the channels of the I/O bus as provided by the signal driver 124. Further, the receiver and decoder circuit 126 may include decoders configured to recover the set of M bitstreams by decoding the N multilevel signals received via the channels of the I/O bus as provided by the signal driver 114. In some embodiments, the receiver and decoder circuit 116 and the receiver and decoder circuit 126 may include comparators and decoding logic to recover the set of M bitstreams.

In operation, the first device 110 and the second device 120 may communicate over the I/O bus to transfer information, such as data, addresses, commands, etc. While the I/O bus is shown to be bidirectional, the I/O bus may also be a unidirectional bus. The I/O interface circuit 112 and I/O interface circuit 122 may implement a multilevel communication architecture. In a multilevel communication architecture, data is sent over a channel during a data period. Data may include a single value on a signal line of a channel, or may be a combination of values provided on a plurality of signal lines of a channel. The data may represent a channel state. A receiver may determine an output signal value based on the value transmitted on the signal line(s) of a channel. In a single-ended architecture, the signal line value may be compared against one or more reference values to determine the output signal value. A receiver has a time period to determine and latch the output signal value from the time the output signal transitions to the current value to the time the output signal transitions to the next value. The transition time may be determined based on a clock signal, as well as a setup and hold time based on a transition from one value to another. In a multilevel communication architecture with a fixed slew rate or fixed rise/fall times, inherent jitter may occur due to differing magnitude shifts (e.g., from VH to VL vs. from VMID to VH or VL. The amount of jitter may be based on the slew rate, the rise/fall times, the multilevel magnitudes' values, or combinations thereof. In some examples, the transition times may also be affected by process, voltage, and temperature variations.

In an example, the signal driver 114 may generate data for a channel by converting a bit from each of the M bitstreams during a data period into N multilevel signals. The data may be transmitted to the receiver and decoder circuit 126 via N signal lines of the I/O bus. The receiver and decoder circuit 126 may detect levels on the N signal lines and decode the levels to retrieve the bit from each of the M streams. By using multilevel signal lines, more data can be transmitted during a data period as compared with using binary signal line levels. In an example, M is 3 and N is 2, and the signal lines of the I/O bus are capable of being driven to three independent voltage levels. In another example, M is 2 and N is 1, and the signal lines of the I/O bus are capable of being driven to four independent voltage levels (e.g., in a PAM implementation). Communication protocol between the signal driver 124 and the receiver and decoder circuit 116 may be similar to the communication protocol between the encoder and signal driver 114 and the receiver and decoder circuit 126. The signal driver 114 may include a DRAM driver that has been segmented to drive multiple (e.g., more than 2) voltage levels on a signal line.

Figure 2A:
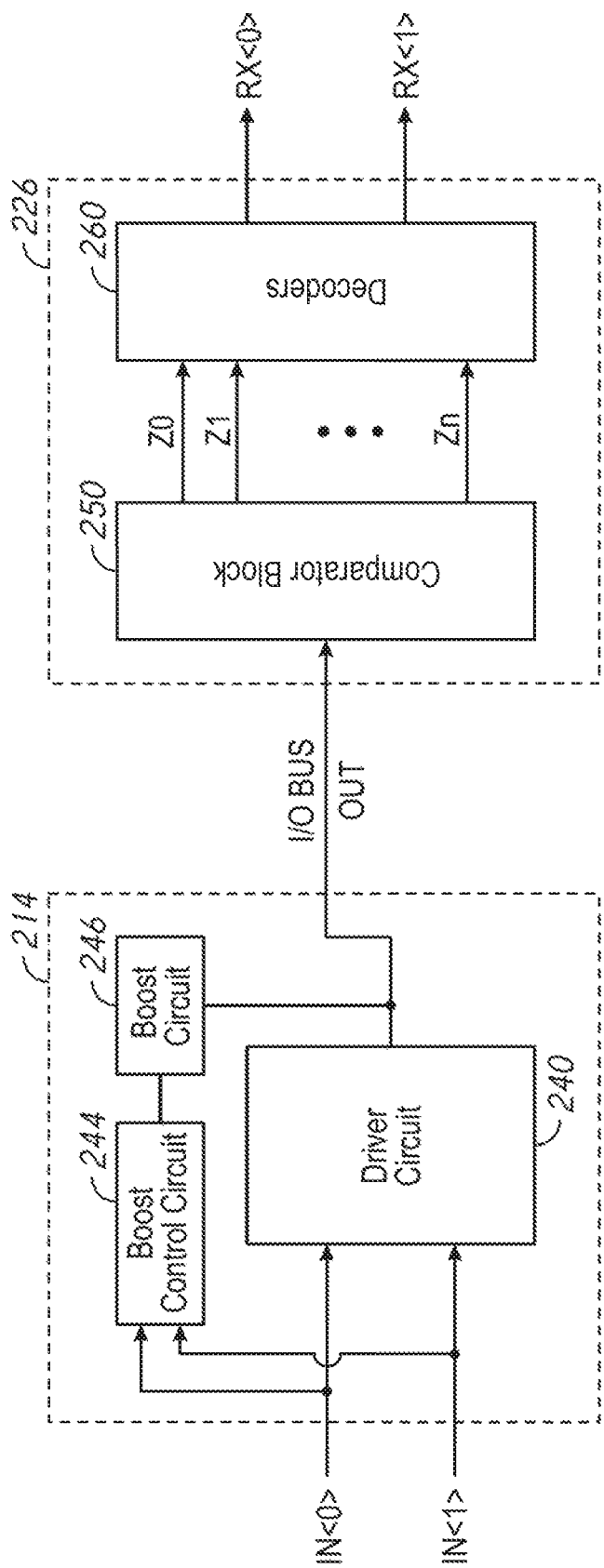
FIG. 2A is a block diagram of an apparatus for a multilevel communication architecture according to an embodiment of the disclosure.

FIG. 2A is a block diagram of an apparatus for a multilevel communication architecture according to an embodiment of the disclosure. The apparatus may include a signal driver 214 coupled to a receiver 226 via an I/O bus. The signal driver 214 may be implemented in the signal driver 114 and/or the signal driver 124 of FIG. 1 and the receiver 226 may be implemented in the receiver and decoder circuit 116 and/or the receiver and decoder circuit 126 of FIG. 1.

The signal driver 214 may include a driver circuit 240. The driver circuit 240 may receive bitstreams IN<1> and IN<0> and drive an output signal OUT in response. The IN<1> and IN<0> bitstreams may represent a stream of two-bit data. The output signal OUT driven by the driver circuit 240 is based on the IN<1> and IN<0> bitstreams. For example, the OUT signal may be a multilevel signal representing data of the IN<0> and IN<1> bitstreams. A PAM4 technique may be used in some embodiments of the disclosure to convert the two-bit data of the IN<1> and IN<0> bitstreams into a multilevel signal having one of four different voltage levels. In some embodiments of the disclosure, the driver circuit 240 may include one or more signal line drivers having a pull-up (e.g., p-type) transistor coupled in series with a pull-down (e.g., n-type) transistor. A source of the pull-up transistor is coupled to a high supply voltage and the source of the pull-down transistor is coupled to a low supply voltage. In some embodiments of the disclosure, the high supply voltage is 1.2 V and the low supply voltage is ground. The output signal OUT is provided at a common node to which the pull-up and pull-down transistors are coupled. Gates of the pull-up and pull-down transistors of the driver circuit 240 are provided with the IN<1> and IN<0> bitstreams. Where a PAM4 conversion is used, the IN<1> bitstream may be provided to a signal line driver having a drive strength that is twice the drive strength of a signal line driver to which the IN<0> bitstream is provided. In such an embodiment, the impedance of the signal line driver to which the IN<1> bitstream is provided is half of the impedance of the signal line driver to which the IN<0> bitstream is provided. In other embodiments of the disclosure, the driver circuit 240 may be implemented using other configurations.

The signal driver 214 further includes a boost control circuit 244 and a boost circuit 246. The boost control circuit 244 provides control signals to control the boost circuit 246 according to the IN<0> and IN<1> bitstreams. The boost circuit 244 may be controlled to provide increased pull-up capability and/or increased pull-down capability for the driver circuit 240 based on current data of the IN<0> and IN<1> bitstreams.

The receiver 226 may include a comparator block 250 coupled to a decoder 260. The comparator 250 may be configured to receive the signal from the I/O bus and provide Z0-Zn signals (n is a whole number) to the decoder 260. The comparator block 250 may include circuits (not shown in FIG. 2A) configured to compare the signal from the I/O bus against reference signals to provide the Z0-Zn signals. For example, the comparator block 250 may include comparators that compare the OUT signal from the I/O bus against various reference signals to provide the Z0-Zn signals. The decoder 260 may include logic to generate the bitstreams RX<0> and RX<1> based on the Z0-Zn signals from the comparator block 250. The RX<0> and RX<1> bitstreams may be logical equivalents of data transmitted by the IN<0> and IN<1> bitstreams. The RX<0> and RX<1> bitstreams may represent a stream of two-bit received data.

In operation, the IN<0> and IN<1> may be bitstreams to be transmitted over the I/O bus. Rather than send each bitstream on a separate signal line, the signal driver 214 may provide a signal based on the IN<0> and IN<1> bitstreams to be transmitted over a signal line using a multilevel signal. For example, the signal driver 214 may receive the IN<0> and IN<1> bitstreams, and during each data period, the driver circuit 240 may drive the signal line of the I/O bus with a voltage that will be used by the receiver 226 to provide the RX<0> and RX<1> bitstreams. The multilevel signal may be used to represent data of the IN<0> and IN<1> bitstreams using fewer signal lines than one signal line per bitstream. For example, as in the embodiment of FIG. 2A, data of the IN<0> and IN<1> bitstreams are provided to the receiver 226 on fewer than two signal lines (e.g., one signal on the I/O bus rather than one signal line for the IN<0> bitstream and another signal line for the IN<1> bitstream).

Figure 3:
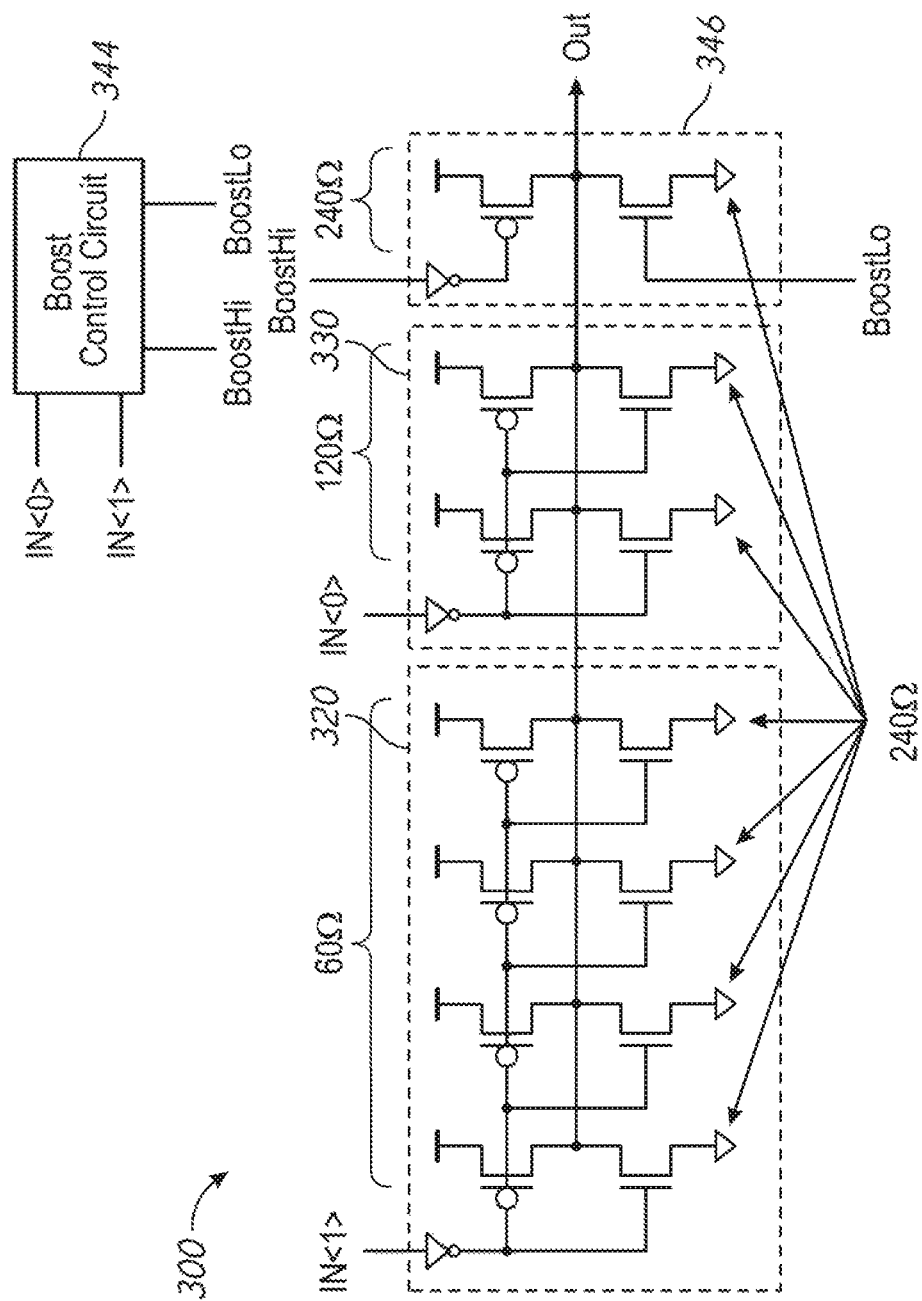
FIG. 3 is a schematic drawing of a signal driver according to an embodiment of the disclosure.

Although FIG. 2A illustrates operation with bitstreams IN<0> and IN<1> for providing bitstreams RX<0> and RX<1>, the number of bitstreams may be different in other embodiments of the disclosure. For example, in some embodiments of the disclosure, a third bitstream IN<2> may also be provided to the signal driver 214 in addition to the IN<0> and IN<1> bitstreams and a multilevel signal may be provided over the I/O bus representing the data from the IN<0>, IN<1>, and IN<2> bitstreams. Such embodiments are within the scope of the present disclosure. FIG. 3 is a schematic drawing of a signal driver 300 according to an embodiment of the disclosure. The signal driver 300 may be used for a multilevel signal architecture implementing pulse-amplitude modulation (PAM). The signal driver 300 may be used as the signal driver 214 in embodiments of the disclosure.

The signal driver 300 includes a driver circuit including six signal line drivers coupled to a common node that is an output. The output may represent an output terminal. Each of the signal line drivers are coupled to a high supply voltage (e.g., VDDQ) and to a low supply voltage (e.g., VSSQ). The driver circuit may be a driver in a DRAM, such as a double data rate (DDR) DRAM driver. In some embodiments of the disclosure, each of the signal line drivers has an impedance of 240 ohms. However, in other embodiments of the disclosure, each of the signal line drivers may have an impedance other than 240 ohms. The signal line drivers are not limited to having the same impedance, and may also have different impedances in embodiments of the disclosure.

The driver circuit may include a first driver section 320 and a second driver section 330 configured to drive an output signal OUT to a common node to which the first and second driver sections 320 and 330 are coupled. A signal line may be coupled to the common node. The output signal OUT driven by the first and second driver sections 320 and 330 may be based on IN<1> and IN<0> bitstreams, which may be provided to the signal line drivers of the driver circuit. The output signal OUT may be a multilevel signal representing data of the IN<1> and IN<0> bitstreams that drives the I/O bus. In some embodiments of the disclosure, "1" data is represented by the IN<1> signal or IN<0> signal having a voltage of 1.2 V, and "0" data is represented by the IN<1> signal or IN<0> signal having a voltage of 0 V. However, other voltage levels may be used to represent the "1" and "0" data in other embodiments of the disclosure.

The first driver section 320 may include four signal line drivers coupled to the common node, each controlled responsive to the IN<1> bitstream. Each signal line driver may include a pull-up (e.g., p-type) transistor and a pull-down (e.g., n-type) transistor. The complement of the IN<1> bitstream is provided to the gates of the pull-up and pull-down transistors by an inverter circuit that receives the IN<1> bitstream. The second driver section 330 may include two signal line drivers coupled to the common node, each controlled responsive to the IN<0> bitstream, and each signal line driver may include, a pull-up (e.g., p-type) transistor and a pull-down (e.g., n-type) transistor. The complement of the IN<0> bitstream is provided to the gates of the pull-up and pull-down transistors by an inverter circuit that receives the IN<0> bitstream. In an embodiment of the disclosure where each signal line driver has an impedance of 240 ohms, the first driver section 320 has an effective impedance of 60 ohms, the second driver section 330 has an effective impedance of 120 ohms. With each of the signal line drivers having the same impedance, the signal line drivers have the same drive strength.

The signal driver 300 further includes a boost circuit 346 that receives control signals BoostHi and BoostLo from boost control circuit 344. The boost control circuit 344 includes logic circuits and provides control signals BoostHi and BoostLo to the boost circuit 346 based on the IN<0> and IN<1> bitstreams. In some embodiments of the disclosure, a BoostHi signal or BoostLo signal having the high logic level is represented by a signal of 1.2 V, and a BoostHi signal or BoostLo signal having the low logic level is represented by a signal of 0 V. However, other voltage levels may be used to represent the "1" and "0" data in other embodiments of the disclosure.

The boost circuit 346 is coupled to the common node and includes a pull-up (e.g., p-type) transistor and a pull-down (e.g., n-type) transistor, which are controlled by the BoostHi and BoostLo signals, respectively. The boost circuit 346 may also be referred to as another driver section of the driver circuit. The complement of the BoostHi signal is provided to the gate of the pull-up transistor by an inverter circuit that receives the BoostHi signal. In the embodiment of FIG. 3, the BoostHi signal provided by the boost control circuit 344 is active when at a high logic level to activate the pull-up transistor and the BoostLo signal is active when at a high logic level to activate the pull-down transistor. When activated by an active BoostHi signal from the boost control circuit 344, the pull-up transistor provides additional drive to pull up the level of the signal line. Similarly, when activated by an active BoostLo signal from the boost control circuit 344, the pull-down transistor provides additional drive to pull down the level of the signal line. As previously discussed, in an embodiment of the disclosure where each signal line driver has an impedance of 240 ohms, the first driver section 320 has an effective impedance of 60 ohms, the second driver section 330 has an effective impedance of 120 ohms. The boost circuit 346 would have an impedance of 240 ohms. As a result, the first driver section 320, second driver section 330, and boost circuit (e.g., third driver section) have different drive strengths from one another. In the particular embodiment shown by FIG. 3, the first driver section 320 has twice the drive strength as the second driver section 330. The second driver section has twice the drive strength of the boost circuit 346 (e.g., a drive strength ratio of 4:2:1 for driver section 320:driver section 330:boost circuit 346). In some embodiments of the disclosure, the boost circuit 346 may have a different drive strength relative to the first and/or second driver sections 320, 330, for example, the second driver section 330 has less than twice the drive strength of the boost circuit 346.

As previously described, embodiments of the disclosure are not limited to each of the driver circuits having an impedance of 240 ohms or having each of the drivers circuits having the same impedance. In some embodiments of the disclosure, the boost circuit may have an impedance that is less than the impedance of the other driver circuits. The boost circuit may also be tunable in some embodiments of the disclosure, such as having an impedance that may be adjusted to provide a desired impedance.

As will be described in more detail below, the pull-up transistor of the boost circuit 346 may be activated when the IN<1> and IN<0> bitstreams represent data corresponding to a voltage level of a high supply voltage (e.g., representing data "11"), and the pull-down transistor may be activated when the IN<1> and IN<0> bitstreams represent data corresponding to a voltage level of a low supply voltage (e.g., representing data "00"). While FIG. 3 shows the boost circuit 346 as including one pull-up transistor and one pull-down transistor, in other embodiments of the disclosure, the boost circuit 346 may include a greater number of pull-up and/or pull-down transistors. Thus, the embodiment of FIG. 3 is not intended to limit boost circuits, or more generally, driver circuits, to embodiments having the specific configuration shown in FIG. 3.

In operation, the signal driver 300 may drive the OUT signal responsive to the IN<1> and IN<0> bitstreams. The IN<1> and IN<0> bitstreams are provided to the signal line drivers of the driver sections 320 and 330 to provide an output signal OUT having an appropriate voltage for the multilevel signal, for example, using PAM to convert a plurality of bitstreams into a multilevel signal.

In some embodiments of the disclosure, PAM4 is used to convert two bitstreams (e.g., the IN<1> and IN<0> bitstreams) into an OUT signal having one of four different voltage levels. The IN<1> bitstream may be provided to the signal line drivers of the first driver section 320 and the IN<0> bitstream may be provided to the signal line drivers of the second driver section 330. The resulting output signal will have one of four different voltages corresponding to the data of the IN<1> and IN<0> bitstreams. For example, where a current data of the IN<1> and IN<0> bitstreams is a "00", the pull-down transistors of both the driver sections 320 and 330 are activated to drive (e.g., pull down) the common node to the low supply voltage to provide an output signal OUT having the voltage of the low supply voltage. Additionally, as previously described, a current data of "00" also causes the pull-down transistor of the boost circuit 346 to provide additional drive to pull down the common node to the low supply voltage. Where a current data of the IN<1> and IN<0> bitstream is a "11", the pull-up transistors of both the driver sections 320 and 330 are activated to drive (e.g., pull up) the common node to the high supply voltage to provide an output signal OUT having the voltage of the high supply voltage. Additionally, as previously described, a current data of "11" also causes the pull-up transistor of the boost circuit 346 to provide additional drive to pull up the common node to the high supply voltage. As illustrated by the example, the pull-up transistor of the boost circuit 346 is activated to drive the common node to the high supply voltage when the first and second driver sections 320 and 330 drive the common node to the high supply voltage. Similarly, the pull-down transistor of the boost circuit 346 is activated to drive the common node to the low supply voltage when the first and second driver sections 320 and 330 drive the common node to the low supply voltage.

Where current data of the IN<1> and IN<0> bitstream is a "01", the pull-down transistors of the driver section 320 are activated and the pull-up transistors of the driver section 330 are activated to provide a voltage to the common node that results in an output signal OUT having an intermediate-low voltage. Lastly, for current data of the IN<1> and IN<0> bitstream is a "10", the pull-up transistors of the driver section 320 are activated and the pull-down transistors of the driver section 330 are activated to provide a voltage to the common node that results in an output signal OUT having an intermediate-high voltage. For a current data of "01" or "10", that is, where the first and second driver sections 320 and 330 are driving the common node to different supply voltages, neither the pull-up nor pull-down transistors of the boost circuit 346 are activated to provide any additional drive to change the voltage of the common node. With both the pull-up and pull-down transistors of the boost circuit 346 deactivated, the boost circuit 346 is in a high-impedance state.

The first driver section 320, the second driver section 330, and the boost circuit 346 are shown in FIG. 3 as including p-type pull-up transistors and n-type pull-down transistors. That is, the pull-up and pull-down transistors have different conductivity types. In other embodiments of the disclosure, the first driver section 320, the second driver section 330. In embodiments of the disclosure using n-type pull-up transistors, which are activated by a high logic level signal (e.g., having the high supply voltage), the logic level of the signals provided to gates of the n-type pull-up transistors will have a complementary logic level to signals provided to the gates of p-type pull-up transistors. A signal having a complementary logic level may be provided by using an inverter circuit.

Figure 4A:
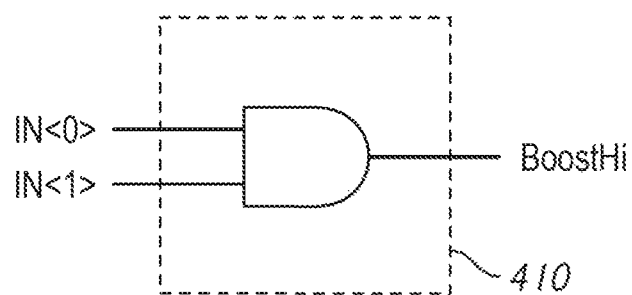
FIG. 4A is a schematic diagram of a boost control circuit according to an embodiment of the disclosure.

FIG. 4A is a schematic diagram of a boost control circuit 410 according to an embodiment of the disclosure. The boost control circuit 410 may be included in the boost control circuit 344 of the signal driver 300 of FIG. 3 in some embodiments of the disclosure. The boost control circuit 410 may control the boost circuit 346 to provide additional drive capability to the driver sections 320 and 330 drive the common node to provide a voltage level of the high supply voltage (e.g., when the IN<1> and IN<0> bitstreams represent "11" data). The boost control circuit 410 includes an AND logic circuit that receives the IN<1> and IN<0> bitstreams and provides the BoostHi signal resulting from a logic AND operation of the IN<1> and IN<0> bitstreams.

In operation, the boost control circuit 410 provides an active. BoostHi signal (e.g., active when a high logic level) when the current data represented by the IN<1> and IN<0> bitstreams is "11", which causes the signal driver 300 to provide the output signal OUT having the voltage of the high supply voltage (e.g., current data of the IN<1> and IN<0> bitstreams is "11"). That is, with the IN<1> a "1" and the IN<0> a "1", the high logic level of the IN<1> bitstream is provided to the line drivers of the first driver section 320 to cause the pull-up transistors to be activated and the high logic level of the IN<0> bitstream is provided to the line drivers of the second driver section 330 to cause the pull-up transistors to be activated. As a result, the common node to which the first and second driver sections 320 and 330 are coupled is pulled up to the voltage of the high supply voltage. Additionally, the high logic levels of the IN<1> and IN<0> bitstreams are provided to the AND logic circuit of the boost control circuit 410 and a logical AND operation is performed to provide an active (e.g., a high logic level) BoostHi signal. The pull-up transistor of the boost circuit 346 is activated by the active BoostHi signal to provide additional drive to further pull up the common node to the voltage of the high supply voltage. Thus, as illustrated by the example operation, the pull-up transistor of the boost circuit 346 is activated to assist in pulling up the common node when the output signal OUT is to be provided having the voltage near or equal to the high supply voltage.

Figure 4B:
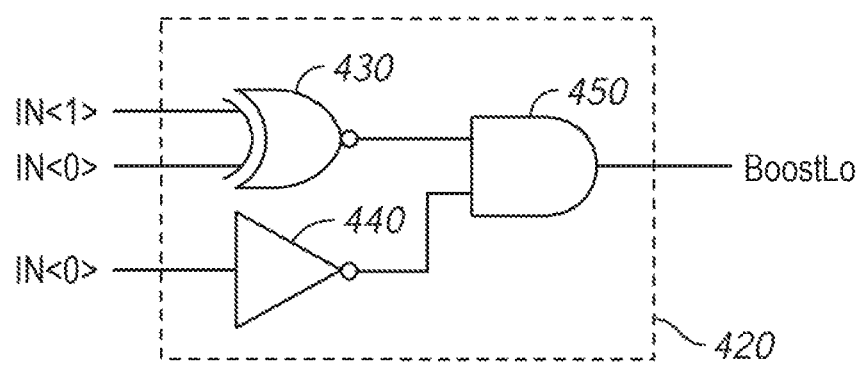
FIG. 4B is a schematic diagram of a boost control circuit according to an embodiment of the disclosure.

FIG. 4B is a schematic diagram of a boost control circuit 420 according to an embodiment of the disclosure. The boost control circuit 420 may be included in the boost control circuit 344 of the signal driver 300 of FIG. 3 in some embodiments of the disclosure. The boost control circuit 420 may control the boost circuit 346 to provide additional drive capability to the driver sections 320 and 330 drive the common node to provide a voltage level of the low supply voltage (e.g., when the IN<1> and IN<0> bitstreams represent "00" data). The boost control circuit 420 includes an exclusive OR (XOR) logic circuit 430 that receives the IN<1> and IN<0> bitstreams and an inverter circuit 440 that receives the IN<0> bitstream. The signals provided by the XOR logic circuit 430 and the inverter circuit 440 are provided to an AND logic circuit 450 which provides the BoostLo signal resulting from a logic AND operation of the signals provided by the XOR logic circuit 430 and the inverter circuit 440.

In operation, the boost control circuit 420 provides an active BoostLo signal (e.g., active when a high logic level) when the current data represented by the IN<1> and IN<0> bitstreams is a "00", which causes the signal driver 300 to provide the output signal OUT having the voltage of the low supply voltage (e.g., current data of the IN<1> and IN<0> bitstreams is "00"). That is, with the IN<1> a "0" and the IN<0> a "0", the low logic level of the IN<1> bitstream is provided to the line drivers of the first driver section 320 to cause the pull-down transistors to be activated and the low logic level of the IN<0> bitstream is provided to the line drivers of the second driver section 330 to cause the pull-down transistors to be activated. As a result, the common node to which the first and second driver sections 320 and 330 are coupled is pulled up to the voltage of the low supply voltage. Additionally, the low logic levels of the IN<1> and IN<0> bitstreams are provided to the XOR logic circuit 430 of the boost control circuit 420 and the IN<0> bitstream is provided to the inverter circuit 440. The outputs of the XOR logic circuit 430 and the inverter circuit 440 are provided to the AND logic circuit 450, and a logical NAND operation is performed to provide an active (e.g., a high logic level) BoostLo signal. The pull-down transistor of the boost circuit 346 is activated by the active BoostLo signal to provide additional drive to further pull down the common node to the voltage of the low supply voltage. Thus, as illustrated by the example operation, the pull-down transistor of the boost circuit 346 is activated to assist in pulling down the common node when the output signal OUT is to be provided having the voltage near or equal to the low supply voltage.

Figure 5A:
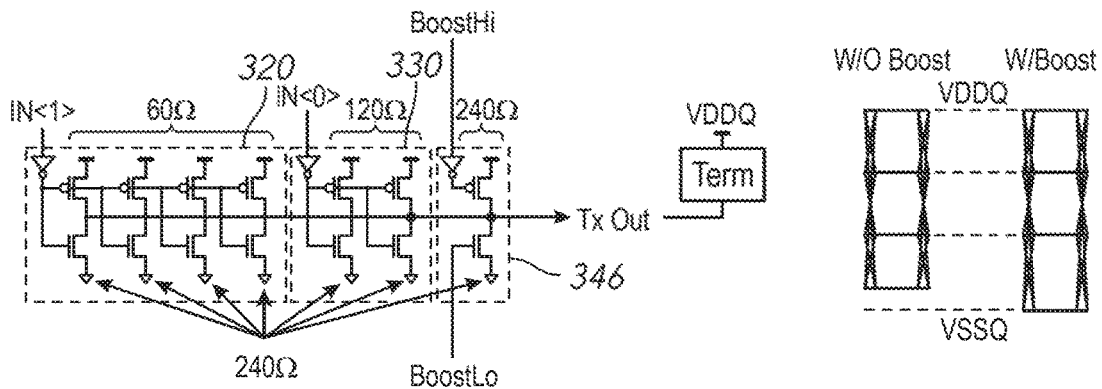
FIGS. 5A-5C are diagrams showing operation of a signal driver according to various embodiments of the disclosure.

FIG. 5A is a diagram showing operation of the first and second driver sections 320 and 330, and the boost circuit 346, of the signal driver 300 for driving a load that is terminated to a high supply voltage (e.g., VDDQ) according to an embodiment of the disclosure. In such a situation, a typical signal driver may not fully drive an output signal OUT to a low supply voltage (e.g., VSSQ, as shown as "w/o Boost"). The high supply voltage may represent a high logic level (e.g., "11") output signal OUT and the low supply voltage may represent a low logic level (e.g., "00") output signal OUT in some embodiments of the disclosure. The inability for the signal driver to fully drive the output signal OUT to the high supply voltage may be due to, for example, variations in circuit performance. The variation in circuit performance may be due to variations in the process when fabricating the circuits, variations in the supply voltages powering the circuits, and/or operating temperature of the circuits, as well as impairments and nonidealities in the transmission channel. As a result, actual circuit performance may deviate from ideal circuit performance. By not fully driving the output signal OUT to the low supply voltage, the voltage margin between the different voltage levels representing the different data is reduced, which may be more susceptible to data errors.

As shown in FIG. 5A (as shown as "w/Boost"), the boost circuit 346 may be used to assist driving the output signal OUT. In particular, the pull-down transistor of the boost circuit 346 may be used to provide additional drive to fully drive the output signal OUT to the low supply voltage when the signal driver 300 provides an output signal OUT having a low logic level. As previously described, the pull-down transistor of the boost circuit 346 may be activated by an active BoostLo signal, which may be provided by boost control circuit (e.g., boost control circuit 344). The BoostLo signal may be active when the signal driver 300 is driving a low logic level output signal OUT.

Figure 5B:
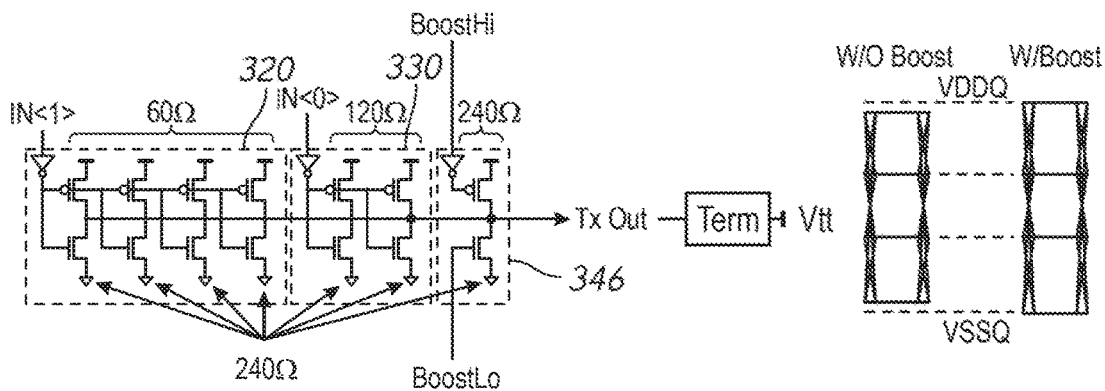

FIG. 5B is a diagram showing operation of the first and second driver sections 320 and 330, and the boost circuit 346, of the signal driver 300 for driving a line terminated load according to an embodiment of the disclosure. In such a situation, a typical signal driver may not fully drive an output signal OUT to either a high or low supply voltage (e.g., VDDQ or VSSQ, as shown as "w/o Boost"). The high supply voltage may represent a high logic level (e.g., "11") output signal OUT and the low supply voltage may represent a low logic level (e.g., "00") output signal OUT in some embodiments of the disclosure. As previously described, the inability for the signal driver to fully drive the output signal OUT to the high supply voltage may be due to, for example, variations in circuit performance. The variation in circuit performance may be due to variations in the process when fabricating the circuits, variations in the supply voltages powering the circuits, and/or operating temperature of the circuits. As a result, actual circuit performance may deviate from ideal circuit performance. As further described, by not fully driving the output signal OUT to either of the high or low supply voltages, the voltage margin between the different voltage levels, representing the different data is reduced, which may be more susceptible to data errors.

As shown in FIG. 5B (as shown as "w/Boost"), the boost circuit 346 may be used to assist driving the output signal OUT. In particular, the pull-down transistor of the boost circuit 346 may be used to provide additional drive to fully drive the output signal OUT to the low supply voltage when the signal driver 300 provides an output signal OUT having a low logic level. Additionally, the pull-up transistor of the boost circuit 346 may be used to provide additional drive to fully drive the output signal OUT to the high supply voltage when the signal driver 300 provides an output signal OUT having a high logic level. As previously described, the pull-down transistor of the boost circuit 346 may be activated by an active BoostLo signal and the pull-up transistor of the boost circuit 346 may be activated by an active BoostHi signal. The BoostLo and BoostHi signals may be provided by a boost control circuit (e.g., boost control circuit 344). The BoostLo signal may be active when the signal driver 300 is driving a low logic level output signal OUT and the BoostHi signal may be active when the signal driver 300 is driving a high logic level output signal OUT.

Figure 5C:
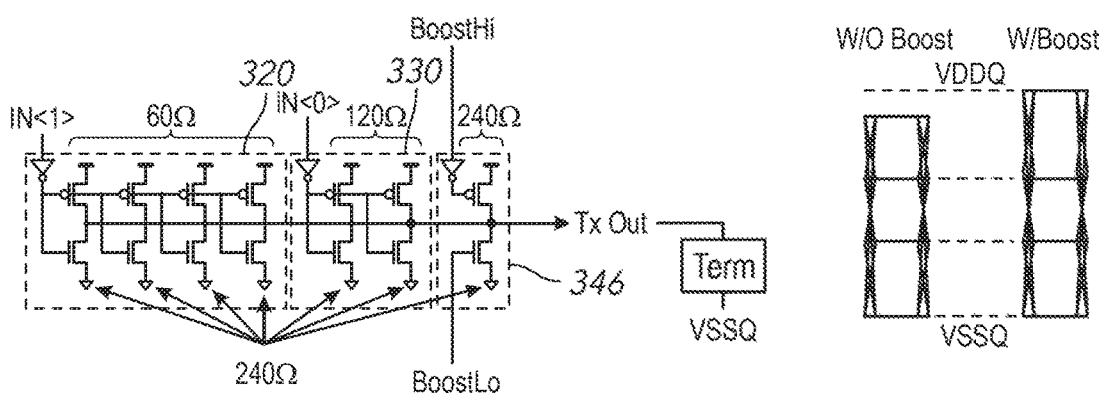

FIG. 5C is a diagram showing operation of the first and second driver sections 320 and 330, and the boost circuit 346, of the signal driver 300 for driving a load that is terminated to a low supply voltage (e.g., VSSQ) according to an embodiment of the disclosure. In such a situation, a typical signal driver may not fully drive an output signal OUT to a high supply voltage (e.g., VDDQ, as shown as "w/o Boost"). The high supply voltage may represent a high logic level (e.g., "11") output signal OUT and the low supply voltage may represent a low logic level (e.g., "00") output signal OUT in some embodiments of the disclosure.

As shown in FIG. 5C (as shown as "w/Boost"), the boost circuit 346 may be used to assist driving the output signal OUT. In particular, the pull-up transistor of the boost circuit 346 may be used to provide additional drive to fully drive the output signal OUT to the high supply voltage when the signal driver 300 provides an output signal OUT having a high logic level. As previously described, the pull-up transistor of the boost circuit 346 may be activated by an active BoostHi signal, which may be provided by boost control circuit (e.g., boost control circuit 344). The BoostHi signal may be active when the signal driver 300 is driving a high logic level output signal OUT.

In some embodiments of the disclosure, the boost circuit 346 may provide additional drive for data corresponding to just one of the supply voltages. For example, in some embodiments of the disclosure, data corresponding to the low supply voltage is boosted, but data corresponding to the high supply voltage is not. The pull-up transistor of the boost circuit 346 may be disabled, circuits for providing signals to activate a pull-up transistor of the boost circuit 346 may not be included in the boost control circuit, circuits for providing signals to activate a pull-up transistor of the boost circuit 346 may not be enabled, or other approaches may be used to not provide boost for data corresponding to the high supply voltage. In other embodiments of the disclosure, the pull-down transistor of the boost circuit 346 may be disabled, so that data corresponding to the high supply voltage is boosted, but data corresponding to the low supply voltage is not. The pull-down transistor of the boost circuit 346 may be disabled, circuits for providing signals to activate a pull-down transistor of the boost circuit 346 may not be included in the boost control circuit, circuits for providing signals to activate a pull-down transistor of the boost circuit 346 may not be enabled, or other approaches may be used to not provide boost for data corresponding to the low supply voltage. In some embodiments of the disclosure, the boost circuit 346 is activated to provide additional drive for data corresponding to both the high supply voltage and the low supply voltage. In such embodiments, the boost control circuit 410 and the boost control circuit 420 may be included together.

Figure 2B:
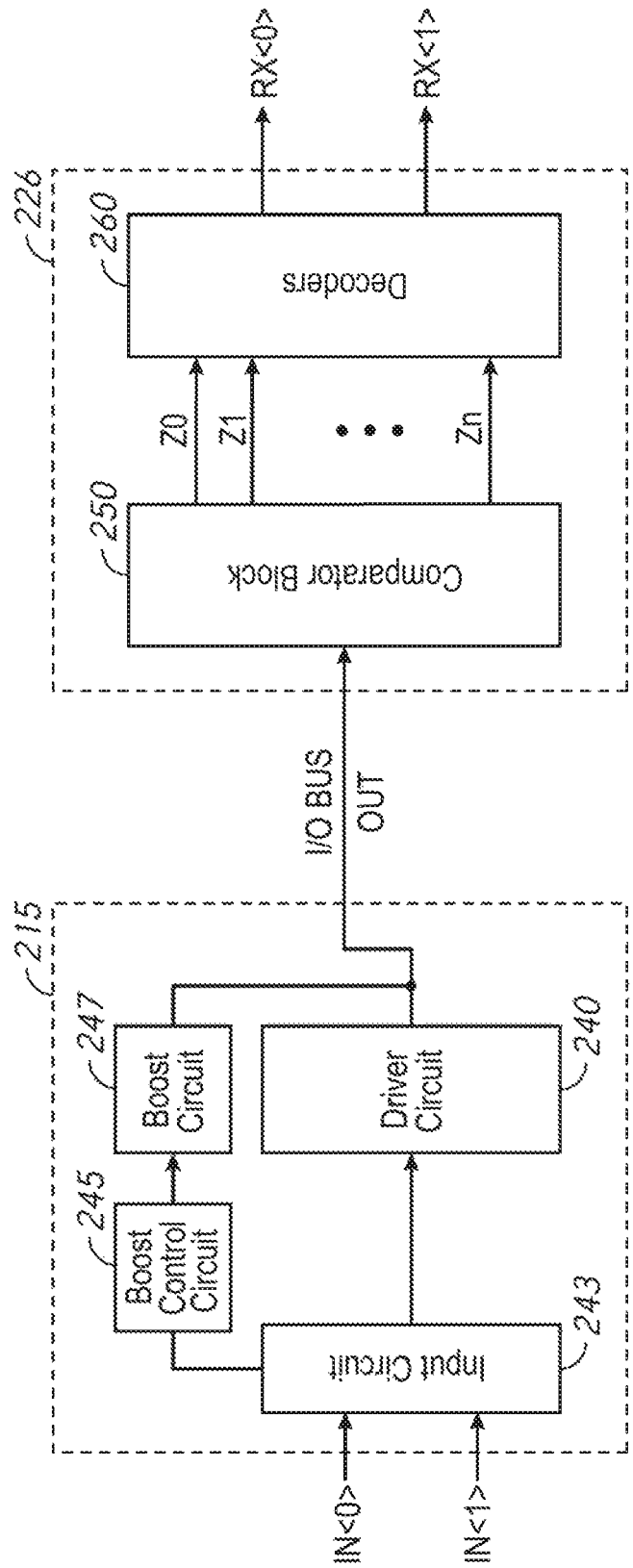
FIG. 2B is a block diagram of an apparatus for a multilevel communication architecture according to an embodiment of the disclosure.

FIG. 2B is a block diagram of an apparatus for a multi-level communication architecture according to an embodiment of the disclosure. The apparatus of FIG. 2B is similar to the apparatus of FIG. 2A, and consequently, the same reference numbers are used in FIG. 2B as in FIG. 2A to identify the same components as previously described. In contrast to the apparatus of FIG. 2A, the apparatus of FIG. 2B includes a signal driver 215 coupled to the receiver 226 via an I/O bus. The receiver 226 may be as previously described with reference to the apparatus of FIG. 2A.

The signal driver 215 may be implemented in the signal driver 114 and/or the signal driver 124 of FIG. 1 and the receiver 226 may be implemented in the receiver and decoder circuit 116 and/or the receiver and decoder circuit 126 of FIG. 1. The signal driver 215 may include an input circuit 243 that receives bitstreams IN<1> and IN<0> and provides output signals to a boost control circuit 245 and a driver circuit 240. The driver circuit 240 may be as previously described with reference to the apparatus of FIG. 2A. The boost control circuit 245 provides control signals to control the boost circuit 247 according to the output signals from the input circuit 243. The boost circuit 247 may be controlled to provide increased pull-up capability and/or increased pull-down capability for the driver circuit 240 based on current data of the IN<0> and IN<1> bitstreams.

In operation, the signal driver 215 may receive the IN<0> and IN<1> bitstreams, and during each data period, the driver circuit 240 may drive the signal line of the I/O bus with a voltage that will be used by the receiver 226 to provide the RX<0> and RX<1> bitstreams. The multilevel signal may be used to represent data of the IN<0> and IN<1> bitstreams using fewer signal lines than one signal line per bitstream. Although FIG. 2B illustrates operation with bitstreams IN<0> and IN<1> for providing bitstreams RX<0> and RX<1>, the number of bitstreams may be different in other embodiments of the disclosure. For example, in some embodiments of the disclosure, a third bitstream IN<2> may also be provided to the signal driver 215 in addition to the IN<0> and IN<1> bitstreams and a multilevel signal may be provided over the I/O bus representing the data from the IN<0>, IN<1>, and IN<2> bitstreams. Such embodiments are within the scope of the present disclosure.

Figure 6:
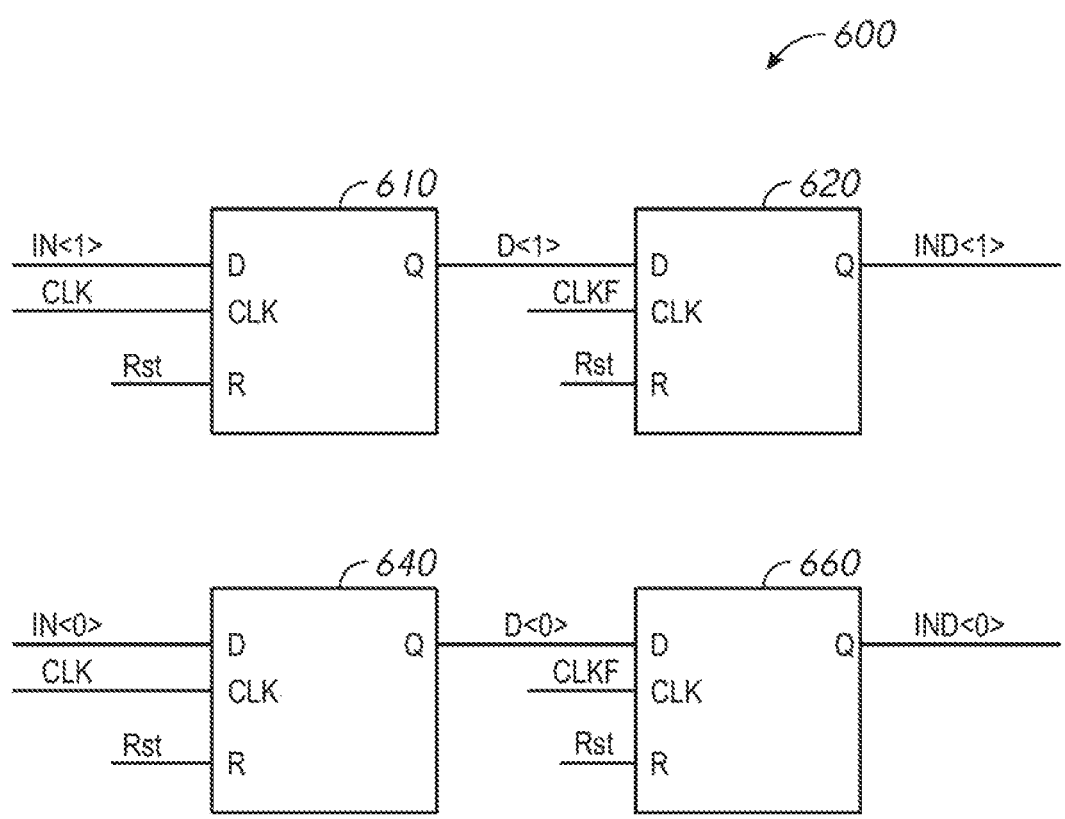
FIG. 6 is a schematic diagram of an input circuit for a boost control circuit according to an embodiment of the disclosure.

FIG. 6 is a schematic diagram of an input circuit 600 according to an embodiment of the disclosure. The input circuit 600 may be included in the input circuit 243 of FIG. 2B in some embodiments of the disclosure. The input circuit 600 includes D flip-flop circuits 610 and 620, and D flip-flop circuits 640 and 660. The D flip-flop circuit 610 receives the IN<1> bitstream and the D flip-flop circuit 640 receives the IN<0> bitstream. The D flip-flop circuit 610 and the D flip-flop circuit 640 are clocked by a clock signal CLK, and the D flip-flop circuit 620 and the D flip-flop circuit 660 are clocked by a clock signal CLKF, which is the complement to the CLK signal. That is, a rising edge of the CLK signal corresponds to a falling edge of the CLKF signal, and a falling edge of the CLK signal corresponds to a rising edge of the CLKF signal. In some embodiments of the disclosure, the CLK signal may be a system clock signal or a clock signal derived from the system clock signal. The system clock signal may be a clock signal provided to different circuits of a larger system in order to synchronize operations, for example, for providing data between the different circuits. The D flip-flop circuits 610, 620, 640, and 660 may be reset to provide an output having a known logic level when an active reset signal RST is provided to the D flip-flop circuits. The D flip-flop circuits 610, 620, 640, and 660 may be reset, for example, upon reset of the semiconductor device, as part of a power up sequence, etc.

For heavily loaded output signals the transitions to extreme low and extreme high levels take more time than transitions between intermediate levels. In operation, the circuit in FIG. 6 detects transitions to extreme levels for the output signal and dynamically boosts these transitions and reduces their durations. The D flip-flop circuit 610 latches a current logic level of the IN<1> bitstream responsive to a rising edge of the CLK signal and provides an output signal D<1> having the same logic level as the latched logic level. The D flip-flop circuit 620 latches the logic level of the D<1> signal responsive to a rising edge of the CLKF signal and provides an output signal IND<1> having the same logic level as the latched logic level. Likewise, the D flip-flop circuit 640 latches a current logic level of the IN<0> bitstream responsive to a rising edge of the CLK signal and provides an output signal D<0> having the same logic level as the latched logic level. The ID flip-flop circuit 660 latches the logic level of the D<0> signal responsive to a rising edge of the CLKF signal and provides an output signal IND<0> having the same logic level as the latched logic level. With reference to the CLK signal, the IN<1> and IN<0> bitstreams are latched and the D<1> and D<0> signals provided responsive to a rising edge of the CLK signal, and the D<1> and D<0> signals are latched and the IND<1> and IND<0> signals are provided responsive to a falling edge of the CLK signal (i.e., the rising edge of the CLKF signal). Thus, the IND<1> and IND<0> signals have the logic levels of the D<1> and D<0> signals delayed by one-half a clock period of the CLK signal.

Figure 7A:
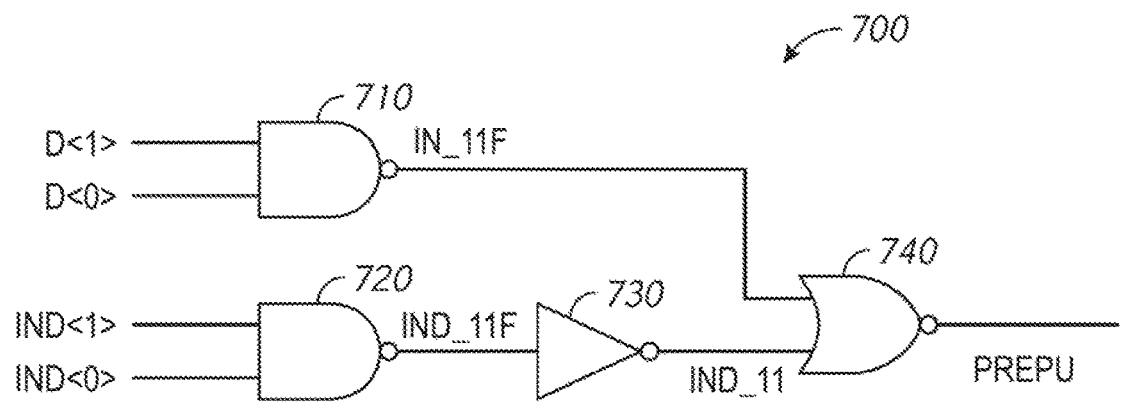
FIG. 7A is a schematic diagram of a pull-up logic circuit for a boost control circuit according to an embodiment of the disclosure.

FIG. 7A is a schematic diagram of a pull-up logic circuit 700 according to an embodiment of the disclosure. The pull-up logic circuit 700 may be included in the boost control circuit 245 of FIG. 2B in some embodiments of the disclosure. The pull-up logic circuit 700 includes a NAND logic circuit 710 that receives the D<1> and D<0> signals, for example, from the input circuit 600, and provides an output signal IN_11F that results from a NAND logic operation of the D<1> and D<0> signals. The pull-up logic circuit 700 further includes a NAND logic circuit 720 that receives the IND<1> and IND<0> signals, for example from the input circuit 600. The NAND logic circuit 720 provides an output signal IND_11F resulting from a NAND logic operation on the IND<1> and IND<0> signals to an inverter circuit 730. The inverter circuit 730 provides an output signal IND_11 that is the complement of the IND_11F signal. A NOR logic circuit receives the IN_11F signal from the NAND logic circuit 710 and the IND_11 signal from the inverter circuit 730 and provides an output signal PREPU that resulting from a NOR logic operation.

In operation, the logic circuit 700 provides an active PREPU signal (e.g., active high logic level) when the data of the IN<1> and IN<0> bitstreams changes from a previous value to a current data of "11". That is, where the previous data represented by the IN<1> and IN<0> bitstreams is "00", "01", or "10", and the data changes to a current data of "11", the logic circuit 700 provides an active PREPU signal. The logic circuit 700 provides and inactive PREPU signal for other changes from a previous data to a current data represented by the IN<1> and IN<0> bitstreams. That is, the logic circuit 700 provides an inactive PREPU signal for the IN<1> and IN<0> bitstreams changing from a previous data to current data of "00", "01", or "10". The active PREPU signal provided by the logic circuit 700 may be used to activate a boost circuit, for example, the boost circuit 346 of the signal driver 300, to provide additional drive to assist driving the common node to the high supply voltage to provide an OUT signal having a voltage of the high supply voltage. As will be described in more detail below, the PREPU signal is active for a portion of the data period of the OUT signal. For example, in some embodiments of the disclosure, the PREPU signal is limited to being active to assist the driving of the common node to the high supply voltage.

The NAND logic circuit 710 provides a low logic level IN_11F signal when D<1> and D<0> are both a high logic level (i.e., resulting from the IN<1> and IN<0> bitstreams representing a current data of "11"). The inverter circuit 730 coupled to the NAND logic circuit 720 to receive the IND_11F signal provides a low logic level IND_11 when IND<1> and IND<0> are both a high logic level (i.e., resulting from D<1> and D<0> both a high logic level). Recall that the IND<1> and IND<0> are delayed relative to D<1> and D<0>, for example, by one-half a clock period of the CLK signal. The NOR logic gate provides an active PREPU signal (e.g. active high logic level) when the IN_11F and IND_11 signals have low logic levels. As a result, the PREPU signal is active when D<1> and D<0> are both at a high logic level, and for one-half a clock cycle of the CLK signal following a rising edge of the CLK signal. The PREPU signal is active for one-half a clock cycle of the CLK signal because the one-half clock cycle delay of the IND<1> and IND<0> relative to D<1> and D<0> will result in the IND_11 signal being at a low logic level while the IN_11F signal is at a low logic level (from D<1> and D<0> both being a high logic level), but for one-half a clock cycle of the CLK signal before both IND<1> and IND<0> also become a high logic level (resulting from the D<1> and D<0> both being at the high logic level). As a result, the PREPU signal is active for one-half a clock cycle of the CLK signal.

Figure 7B:
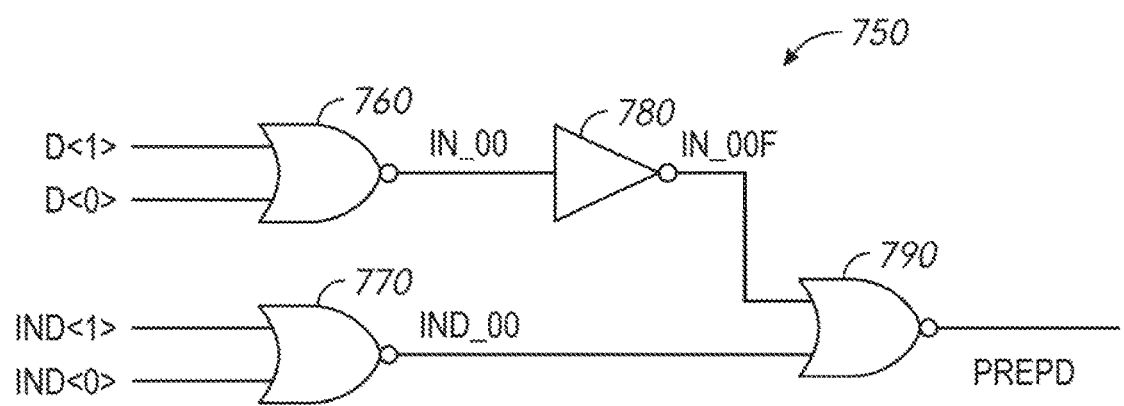
FIG. 7B is a schematic diagram of a pull-down logic circuit for a boost control circuit according to an embodiment of the disclosure.

FIG. 7B is a schematic diagram of a pull-down logic circuit 750 according to an embodiment of the disclosure. The pull-down logic circuit 750 may be included in the boost control circuit 245 of FIG. 2B in some embodiments of the disclosure. The pull-down logic circuit 750 includes a NOR logic circuit 760 that receives the D<1> and D<0> signals, for example, from the input circuit 600, and provides an output signal IN_00 that results from a NOR logic operation of the D<1> and D<0> signals. The IN_00 signal is provided to an inverter circuit 780. The inverter circuit 780 provides an output signal IN_00F that is the complement of the IN_00 signal. The pull-down logic circuit 750 further includes a NOR logic circuit 770 that receives the IND<1> and IND<0> signals, for example from the input circuit 600, and provides an output signal IND_00 resulting from a NOR logic operation on the IND<1> and IND<0> signals. A NOR logic circuit receives the IN_00F signal from the inverter circuit 780 and the IND_00 signal from the NOR logic circuit 770 and provides an output signal PREPD that resulting from a NOR logic operation.

In operation, the logic circuit 750 provides an active PREPD signal (e.g., active high logic level) when the data of the IN<1> and IN<0> bitstreams, changes from a previous value to a current data of "00". That is, where the previous data represented by the IN<1> and IN<0> bitstreams is "01", "10", or "11", and the data changes to a current data of "00", the logic circuit 750 provides an active PREPD signal. The logic circuit 750 provides and inactive PREPD signal for other changes from a previous data to a current data represented by the IN<1> and IN<0> bitstreams. That is, the logic circuit 750 provides an inactive PREPD signal for the IN<1> and IN<0> bitstreams changing from a previous data to current data of "01", "10", or "11". The active PREPD signal provided by the logic circuit 750 may be used to activate a boost circuit, for example, the boost circuit 346 of the signal driver 300, to provide additional drive to assist driving the common node to the low supply voltage to provide an OUT signal having a voltage of the low supply voltage. As will be described in more detail below, the PREPD signal is active for a portion of the data period of the OUT signal. For example, in some embodiments of the disclosure, the PREPD signal is limited to being active to assist the driving of the common node to the low supply voltage.

The inverter circuit 780 coupled to the NOR logic circuit 760 provides a low logic level IN_00F signal when D<1> and D<0> are both a low logic level. (i.e., resulting from the IN<1> and IN<0> bitstreams representing a current data of "00"). The NOR logic circuit 770 provides a high logic level IND_00 signal when IND<1> and IND<0> are both a low logic level (i.e., resulting from D<1> and D<0> both a low logic level). Recall that the IND<1> and IND<0> are delayed relative to D<1> and D<0>, for example, by one-half a clock period of the CLK signal. The NOR logic gate 790 provides an active PREPD signal (e.g. active high logic level) when the IN_00F and IND_00 signals have low logic levels. As a result, the PREPD signal is active when D<1> and D<0> are both at a low logic level, and for one-half a clock cycle of the CLK signal following a rising edge of the CLK signal. The PREPD signal is active for one-half a clock cycle of the CLK signal because the one-half clock cycle delay of the IND<1> and IND<0> relative to D<1> and D<0> will result in the IND_00 signal being at a low logic level while the IN_00F signal is at a low logic level (from D<1> and D<0> both being a low logic level), but for one-half a clock cycle of the CLK signal before both IND<1> and IND<0> also become a low logic level (resulting from the D<1> and D<0> both being at the low logic level) and the NOR logic circuit 770 provides a high logic level IND_00. As a result, the PREPD signal is active for one-half a clock cycle of the CLK signal.

In some embodiments of the disclosure, the boost circuit 346 of the signal driver 300 is temporarily activated to provide additional drive for long data transitions towards both the highest output level and the lowest output level. In such embodiments, the boost control circuit 700 and 750 may be used together to control the boost circuit 346.

Figure 8:
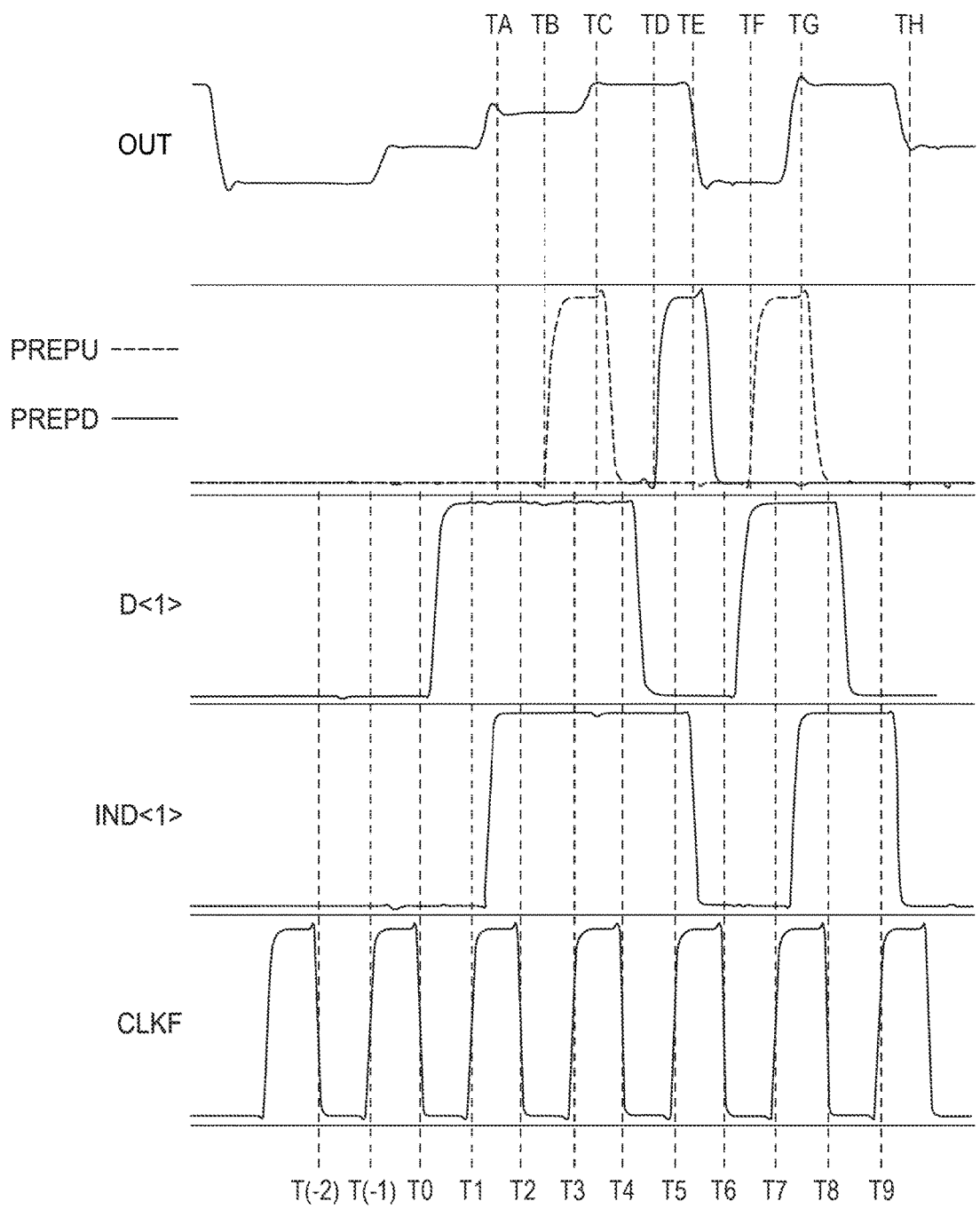
FIG. 8 is a timing diagram showing various signals during operation of a signal driver according to an embodiment of the disclosure.

FIG. 8 is a timing diagram showing various signals during operation of signal driver 300 with the input circuit 600 and pull-up and pull-down logic circuits 700 and 750 according to an embodiment of the disclosure. In the present example, the IND<1> signal is provided to the first driver section 320 instead of the IN<1> bitstream and the IND<0> signal is provided to the second driver section 330 instead of the IN<0> bitstream. The PREPU and PREPD signals are provided to the boost circuit 346 instead of the BoostHi and BoostLo signals. In the example of FIG. 8, the output is terminated to a high supply voltage, resulting in "11" data represented by 1.2 V, "10" data represented by 1.0 V, "01" data represented by 0.8 V, and "00" data represented by 0.6 V. For the OUT signal shown in FIG. 8, rising transition additional drive is provided for transitions TC and TG via PREPU control signal and falling transition additional drive is provided for transition TE via PREPD control signal. Other embodiments of the disclosure may use other voltage levels to represent the data values.

Prior to time T(−2) the D<1> and D<0> signals are "00," as reflected by an OUT signal provided having a voltage of the low supply voltage. At time T(−2) the D flip-flops 610 and 640 of the input circuit 600 are clocked by a rising edge of the CLK signal (shown in FIG. 8 as corresponding to a falling edge of the CLKF signal) and the data of the IN<1> and IN<0> bitstreams is latched to provide the D<1> and D<0> signals. In the present example, the data at time T(−2) is "01". The D flip-flop 610 provides a low logic level D<1> signal and the D flip-flop 640 provides a high logic level D<0> signal (not shown in FIG. 8) shortly after time T(−2). At time T(−1), the D flip-flops 620 and 660 of the input circuit 600 are clocked by a rising edge of the CLKF signal (corresponding to a falling edge of the CLK signal). The low logic level of the D<1> signal is latched by the D flip-flop 620 to provide a low logic level IND<1> signal and the high logic level of the D<0> signal is latched by the D flip-flop 660 to provide a high logic level IND<0> signal (not shown in FIG. 8) shortly after time T(−1). The IND<1> and IND<0> signals are provided to the driver circuit 300 to cause the pull-down transistors of the first driver section 320 to be activated and to cause the pull-up transistors of the second driver section 330 to be activated, resulting in providing an OUT signal having an intermediate-low voltage (corresponding to output data of "01"). Neither the pull-up nor pull-down transistors of the boost circuit 346 are activated by the current data of "01".

At time T0 the D flip-flops 610 and 640 of the input circuit 600 are clocked by a rising edge of the CLK signal and the data of the IN<1> and IN<0> bitstreams is latched to provide the D<1> and D<0> signals. In the present example, the data at time T0 is "10". The D flip-flop 610 provides a high logic level D<1> signal and the D flip-flop 640 provides a low logic level D<0> signal (not shown in FIG. 8) shortly after time T0. At time T1, the D flip-flops 620 and 660 of the input circuit 600 are clocked by a rising edge of the CLKF signal (corresponding to a falling edge of the CLK signal). The high logic level of the D<1> signal is latched by the D flip-flop 620 to provide a high logic level IND<1> signal and the low logic level of the D<0> signal is latched by the D flip-flop 660 to provide a low logic level IND<0> signal (not shown in FIG. 8) shortly after time T1. The IND<1> and IND<0> signals are provided to the driver circuit 300 to cause the pull-up transistors of the first driver section 320 to be activated and to cause the pull-down transistors of the second driver section 330 to be activated, resulting in providing an OUT signal having an intermediate-high voltage (corresponding to output data of "10") at time TA. Neither the pull-up nor pull-down transistors of the boost circuit 346 are activated by the current data of "10".

At time T2 the D flip-flops 610 and 640 of the input circuit 600 are clocked by a rising edge of the CLK signal and the data of the IN<1> and IN<0> bitstreams is latched to provide the D<1> and D<0> signals. The data at time T2 is "11". The D flip-flop 610 maintains a high logic level D<1> signal and the D flip-flop 640 provides a high logic level D<0> signal (not shown in FIG. 8) shortly after time T2. The NAND logic circuit 710 of the pull-up logic circuit 700 provides a low logic level IN_11F signal due to the high logic levels of the D<1> and D<0> signals. With the IND_11 signal provided by the inverter circuit 730 still at a low logic level from the previous data of "10", the XOR logic circuit 740 provides an active PREPU signal at time TB. The active PREPU signal activates the pull-up transistor of the boost circuit 346 to provide additional drive to pull up the common node in providing the OUT signal.

At time T3, the D flip-flops 620 and 660 of the input circuit 600 are clocked by a rising edge of the CLKF signal. The high logic level of the D<1> signal is latched by the D flip-flop 620 to maintain a high logic level IND<1> signal and the high logic level of the D<0> signal is latched by the D flip-flop 660 to provide a high logic level IND<0> signal (not shown in FIG. 8) shortly after time T3. The IND<1> and IND<0> signals are provided to the signal driver 300 to cause the pull-up transistors of the first driver section 320 to be activated and to cause the pull-up transistors of the second driver section 330 to be activated, along with the activated pull-up transistor of the boost circuit 346 that provides additional drive to the common node. As a result, an OUT signal is provided having a voltage of the high supply voltage (corresponding to output data of "11") at time TC.

After the IND<1> and IND<0> signals propagate through the NAND logic circuit 720 and the inverter circuit 730 of the pull-up logic circuit 700, the IND_11 signal switches to a high logic level, which causes the XOR logic circuit 740 to provide an inactive PREPU signal. The change of the PREPU signal to inactive deactivates the pull-up transistor of the boost circuit 346. Thus, when the present data represented by the IN<1> and IN<0> bitstreams is "11", the boost circuit 346 provides additional drive to pull up the common node to the high supply voltage for a portion of the data period of the OUT signal, for example, during the transition of the OUT signal to the high supply voltage. The voltage of the OUT signal changes during the transition from one voltage level to another.

At time T4 the D flip-flops 610 and 640 of the input circuit 600 are clocked by a rising edge of the CLK signal and the data of the IN<1> and IN<0> bitstreams is latched to provide the D<1> and D<0> signals. The data at time T4 is "00". The D flip-flop 610 provides a low logic level D<1> signal and the D flip-flop 640 provides a low logic level D<0> signal (not shown in FIG. 8) shortly after time T4. The inverter circuit 780 of the pull-down logic circuit 750 provides a low logic level IN_00F signal when the NOR logic circuit 760 receives low logic level D<1> and D<0> signals. At this time, the IND_00 signal provided by the NAND logic circuit 770 is still at a low logic level from the previous data of "11", which results in the NOR logic circuit 790 providing an active PREPD signal at time TD. The active PREPD signal activates the pull-down transistor of the boost circuit 346 to provide additional drive to pull down the common node in providing the OUT signal.

At time T5, the D flip-flops 620 and 660 of the input circuit 600 are clocked by a rising edge of the CLKF signal. The low logic level of the D<1> signal is latched by the D flip-flop 620 to provide a low logic level IND<1> signal and the low logic level of the D<0> signal is latched by the D flip-flop 660 to provide a low logic level IND<0> signal (not shown in FIG. 8) shortly after time T5. The IND<1> and IND<0> signals are provided to the signal driver 300 to cause the pull-down transistors of the first driver section 320 to be activated and to cause the pull-down transistors of the second driver section 330 to be activated, along with the activated pull-down transistor of the boost circuit 346 that provides additional drive to the common node. As a result, an OUT signal is provided having a voltage of the low supply voltage (corresponding to output data of "00") at time TE.

After the IND<1> and IND<0> signals propagate through the NOR logic circuit 770 of the pull-down logic circuit 750, the IND_00 signal switches to a high logic level, which causes the XOR logic circuit 790 to provide an inactive PREPD signal. The change of the PREPD signal to inactive deactivates the pull-down transistor of the boost circuit 346. Thus, when the present data represented by the IN<1> and IN<0> bitstreams is "00", the boost circuit 346 provides additional drive to pull down the common node to the low supply voltage for a portion of the data period of the OUT signal, for example, during the transition of the OUT signal to the low supply voltage. As previously described, the voltage of the OUT signal changes during the transition from one voltage level to another.

At time T6 the D flip-flops 610 and 640 of the input circuit 600 are clocked by a rising edge of the CLK signal and the data of the IN<1> and IN<0> bitstreams is latched to provide the D<1> and D<0> signals. The data at time T6 is "11". The D flip-flop 610 provides a high logic level D<1> signal and the D flip-flop 640 provides a high logic level D<0> signal (not shown in FIG. 8) shortly after time T6. The pull-up logic circuit 700 responds by providing an active PREPU signal at time TF to activate the pull-up transistor of the boost circuit 346 to provide additional drive to pull up the common node in providing the OUT signal.

At time T7, the D flip-flops 620 and 660 of the input circuit 600 are clocked by a rising edge of the CLKF signal. The high logic level of the D<1> signal is latched by the D flip-flop 620 to provide a high logic level IND<1> signal and the high logic level of the D<0> signal is latched by the ID flip-flop 660 to provide a high logic level IND<0> signal (not shown in FIG. 8) shortly after time T7. The pull-up transistors of the first and second driver sections 320 and 330 of the signal driver circuit 300 are activated, along with the activated pull-up transistor of the boost circuit 346 to drive the common node to the voltage of the high supply voltage and provide an OUT signal having a voltage of the high supply voltage (corresponding to output data of "11") at time TG. After the IND<1> and IND<0> signals propagate through the NAND logic circuit 720 and the inverter circuit 730 of the pull-up logic circuit 700, the IND_11 signal switches to a high logic level and the XOR logic circuit 740 provides an inactive PREPU signal. The inactive PREPU signal deactivates the pull-up transistor of the boost circuit 346.

At time T8 the D flip-flops 610 and 640 of the input circuit 600 are clocked by a rising edge of the CLK signal and the data of the IN<1> and IN<0> bitstreams is latched to provide the D<1> and D<0> signals. The data at time T0 is "01". The ID flip-flop 610 provides a low logic level D<1> signal and the D flip-flop 640 provides a high logic level D<0> signal (not shown in FIG. 8) shortly after time T8. At time T9, the D flip-flops 620 and 660 of the input circuit 600 are clocked by a rising edge of the CLKF signal. The low logic level of the D<1> signal is latched by the D flip-flop 620 to provide a low logic level IND<1> signal and the high logic level of the D<0> signal is latched by the D flip-flop 660 to provide a high logic level IND<0> signal (not shown in FIG. 8) shortly after time T9. The IND<1> and IND<0> signals are provided to the signal driver 300 to cause the pull-down transistors of the first driver section 320 to be activated and to cause the pull-up transistors of the second driver section 330 to be activated, resulting in providing an OUT signal having an intermediate-low voltage (corresponding to output data of "01") at time TH. Neither the pull-up nor pull-down transistors of the boost circuit 346 are activated by the current data of "01".

In summary:

Prior to time T(−2) the D<1:0> signals start at "00", resulting in the IND<1:0> signals being at "00".

The D<1:0> signals become "01" following the time T(−2) rising CLK edge (corresponding to a falling CLKF edge) and the IND<1:0> signals become "01" following the T(−1) falling CLK edge (corresponding to a rising CLKF edge). The OUT signal changes from "00" to "01".

The D<1:0> signals become "10" following the T0 rising CLK edge and the IND<1:0> signals become "10" following the T1 falling CLK edge. The OUT signal changes from "01" to "10".

The D<1:0> signals become "11" following the T2 rising CLK edge. The PREPU signal becomes a "1". The OUT signal transitions from "10" to "11", and benefits from additional pull-up drive. The IND<1:0> signals become "11" after the T3 falling CLK edge. The PREPU signal becomes a "0". The additional pull-up drive is terminated after one-half of the clock period of the CLK signal.

The D<1:0> signals become "00" following the T4 rising CLK edge. The PREPD signal becomes a "1". The OUT signal transitions from "11" to "00", and benefits from additional pull-down drive. The IND<1:0> signals become "00" following the T5 falling CLK edge. The PREPD signal becomes "0". The additional pull-down drive is terminated after one-half of the clock period of the CLK signal.

The D<1:0> signals become "11" following the T6 rising CLK edge. The PREPU signal becomes a "1". The OUT signal transitions from "00" to "11", and benefits from additional pull-up drive. The IND<1:0> signals become "11" following the T7 falling CLK edge. The PREPU signal becomes a "0". The additional pull-up drive is terminated after one-half of the clock period of the CLK signal.

The D<1:0> signals become "01" following the T8 rising CLK edge. The IND<1:0> signals become "01" following the T9 falling CLK edge. The OUT signal changes from "11" to "01".

As illustrated by the previous example of FIG. 8, the D<1> and D<0> signals are updated after the rising edges of the CLK signal (corresponding to the falling edges of the CLKF signal). The IND<1> and IND<0> signals are updated after the falling edges of the CLK signal (corresponding to the rising edges of the CLKF signal). The PREPU, PREPD signals may be asserted after the rising edges of the CLK signal and reset after the falling edges of the CLK signal. The OUT signal is updated after D<1> and D<0> signals settle. For example, the D<1> and D<0> signals are updated after the rising edges of the CLK signal plus some more propagation delay.

Figure 9A:
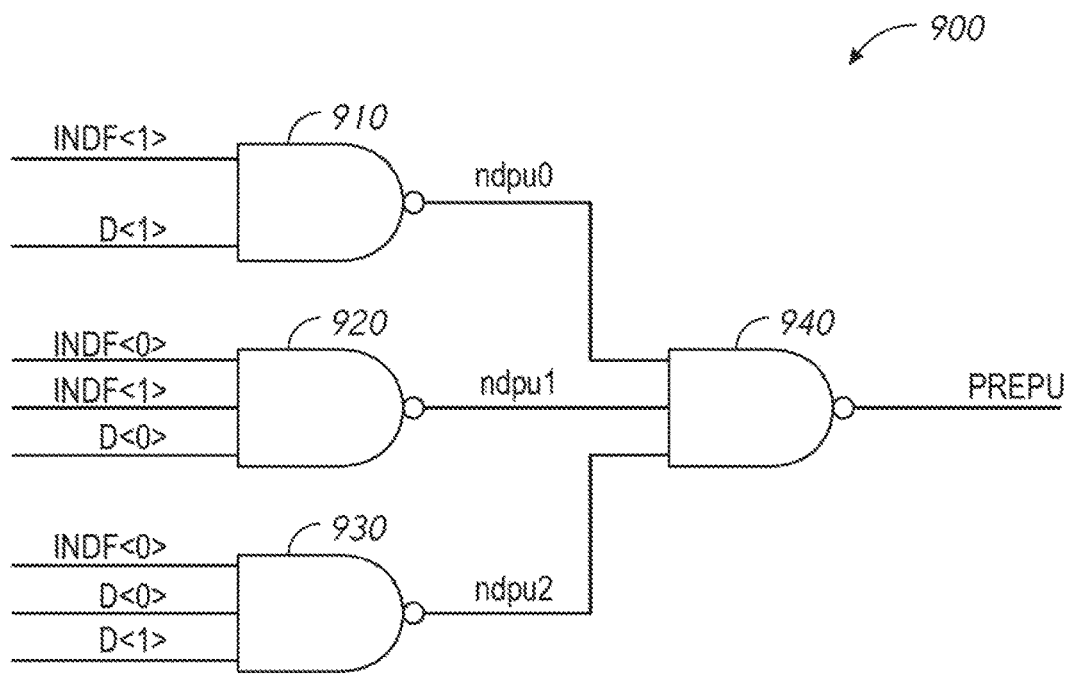
FIG. 9A is a schematic diagram of a pull-up logic circuit for a boost control circuit according to an embodiment of the disclosure.

FIG. 9A is a schematic diagram of a pull-up logic circuit 900 according to an embodiment of the disclosure. The pull-up logic circuit 900 may be included in the boost control circuit 245 of FIG. 2B in some embodiments of the disclosure. The pull-up logic circuit 900 includes a NAND logic circuit 910 that receives the D<1> and INDF<1> signals. The input circuit 600 may provide the D<1> signal, and the input circuit 600 may further provide an IND<1> signal. The INDF<1> signal is the complement of the IND<1> signal, and may be provided by an inverter circuit (not shown) that receives the IND<1> signal from the input circuit 600 and provides the INDF<1> signal. The NAND logic circuit 910 provides an output signal ndpu0 that results from a NAND logic operation of the D<1> and INDF<1> signals. The pull-up logic circuit 900 further includes NAND logic circuits 920 and 930. The NAND logic circuit 920 receives the D<0>, INDF<1>, INDF<0> signals. The input circuit 600 may provide the D<0> signal, and the input circuit 600 may further provide a IND<0> signal. The INDF<0> signal is the complement of the IND<0> signal, and may be provided by an inverter circuit (not shown) that receives the IND<0> signal from the input circuit 600 and provides the INDF<0> signal. The NAND logic circuit 920 provides an output signal ndpu1 that results from a NAND logic operation of the D<0>, INDF<1>, and INDF<0> signals. The NAND logic circuit 930 receives the D<1>, D<0>, and INDF<0> signals. The NAND logic circuit 930 provides an output signal ndpu2 that results from a NAND logic operation of the D<1>, D<0>, and INDF<0> signals. A NAND logic circuit 940 receives the ndpu0, ndpu1, and ndpu2 signals from the NAND logic circuits 910, 920, and 930 and provides an output signal PREPU that results from a NAND logic operation. The PREPU signal may be used to control the pull-up transistor of the boost circuit 346.

In operation, the pull-up logic circuit 900 provides an active PREPU signal (e.g., active high logic level) when the data of the IN<1> and IN<0> bitstreams changes from a previous data to a current data that is represented by a higher voltage than the previous data. That is, where the previous data represented by the IN<1> and IN<0> bitstreams is "00", the pull-up logic circuit 900 provides an active PREPU signal for a current data of "01", "10", and "11"; where the previous data represented by the IN<1> and IN<0> bitstreams is "01", the pull-up logic circuit 900 provides an active PREPU signal for a current data of "10" and "11"; and where the previous data represented by the IN<1> and IN<0> bitstreams is "10", the pull-up logic circuit 900 provides an active PREPU signal for a current data of "11". The active PREPU signal provided by the logic circuit 900 may be used to activate a boost circuit, for example, the boost circuit 346 of the signal driver 300, to provide additional drive to assist driving the common node to a higher voltage to provide an OUT signal. As will be described in more detail below, the PREPU signal is active for a portion of the data period of the OUT signal. For example, in some embodiments of the disclosure, the PREPU signal is limited to being active to assist the driving of the common node during a transition to a higher voltage when changing to current data that is represented by a higher voltage than the previous data. That is, the voltage of the OUT signal changes during the transition from one voltage level to another.

Figure 9B:
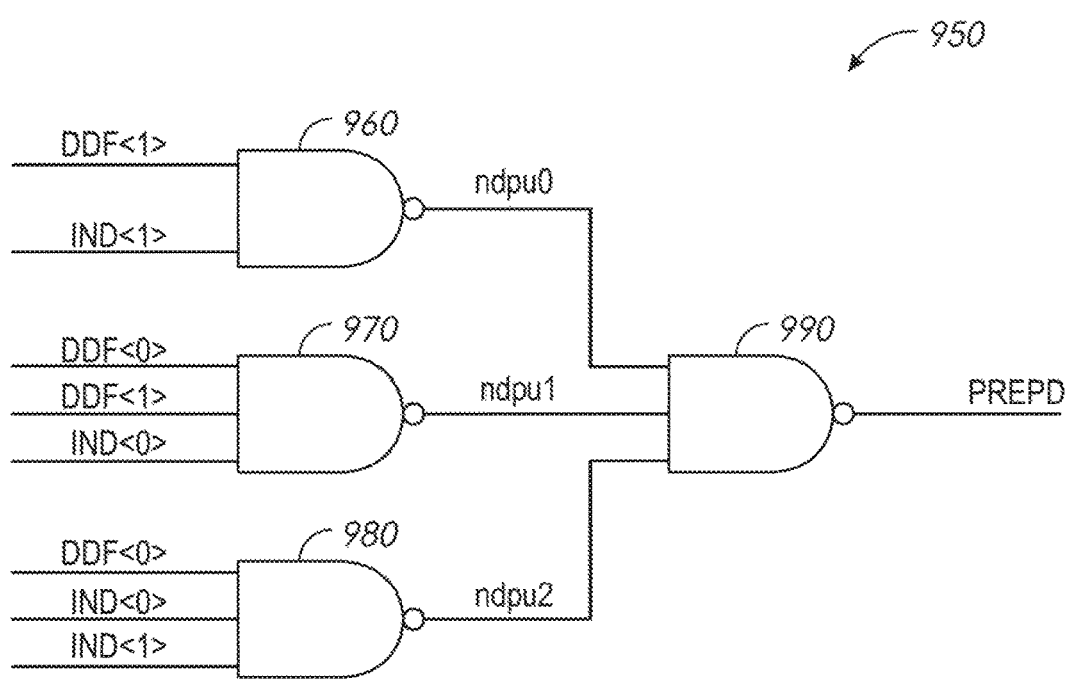
FIG. 9B is a schematic diagram of a pull-down logic circuit for a boost control circuit according to an embodiment of the disclosure.

FIG. 9B is a schematic diagram of a pull-down logic circuit 950 according to an embodiment of the disclosure. The pull-down logic circuit 950 may be included in the boost control circuit 245 of FIG. 2B in some embodiments of the disclosure. The pull-down logic circuit 950 includes a NAND logic circuit 960 that receives the IND<1> and DDF<1> signals. The input circuit 600 may provide the IND<1> signal, and the input circuit 600 may further provide a D<1> signal. The DDF<1> signal is the complement of the D<1> signal, and may be provided by an inverter circuit (not shown) that receives the D<1> signal from the input circuit 600 and provides the DDF<1> signal. The NAND logic circuit 960 provides an output signal ndpd0 that results from a NAND logic operation of the DDF<1> and IND<1> signals. The pull-down logic circuit 950 further includes NAND logic circuits 970 and 980. The NAND logic circuit 970 receives the IND<0>, DDF<1>, DDF<0> signals. The input circuit 600 may provide the IND<0> signal, and the input circuit 600 may further provide a D<0> signal. The DDF<0> signal is the complement of the D<0> signal, and may be provided by an inverter circuit (not shown) that receives the D<0> signal from the input circuit 600 and provides the DDF<0> signal. The NAND logic circuit 970 provides an output signal ndpd1 that results from a NAND logic operation of the IND<0>, DDF<1>, and DDF<0> signals. The NAND logic circuit 980 receives the IND<1>, IND<0>, and DDF<0> signals. The NAND logic circuit 980 provides an output signal ndpd2 that results from a NAND logic operation of the IND<1>, IND<0>, and DDF<0> signals. A NAND logic circuit 990 receives the ndpd0, ndpd1, and ndpd2 signals from the NAND logic circuits 960, 970, and 980 and provides an output signal PREPD that results from a NAND logic operation. The PREPD signal may be used to control the pull-down transistor of the boost circuit 346.

In operation, the pull-down logic circuit 950 provides an active PREPD signal (e.g., active high logic level) when the data of the IN<1> and IN<0> bitstreams changes from a previous data to a current data that is represented by a lower voltage than the previous data. That is, where the previous data represented by the IN<1> and IN<0> bitstreams is "11", the pull-down logic circuit 950 provides an active PREPD signal for a current data of "00", "01", and "10"; where the previous data represented by the IN<1> and IN<0> bitstreams is "10", the pull-down logic circuit 950 provides an active PREPD signal for a current data of "01" and "00"; and where the previous data represented by the IN<1> and IN<0> bitstreams is "01", the pull-up logic circuit 950 provides an active PREPD signal for a current data of "00". The active PREPD signal provided by the logic circuit 950 may be used to activate a boost circuit, for example, the boost circuit 346 of the signal driver 300, to provide additional drive to assist driving the common node to a lower voltage to provide an OUT signal. As will be described in more detail below, the PREPD signal is active for a portion of the data period of the OUT signal. For example, in some embodiments of the disclosure, the PREPD signal is limited to being active to assist the driving of the common node during a transition to a lower voltage when changing to current data that is represented by a lower voltage than the previous data. That is, the voltage of the OUT signal changes during the transition from one voltage level to another.

Figure 10:
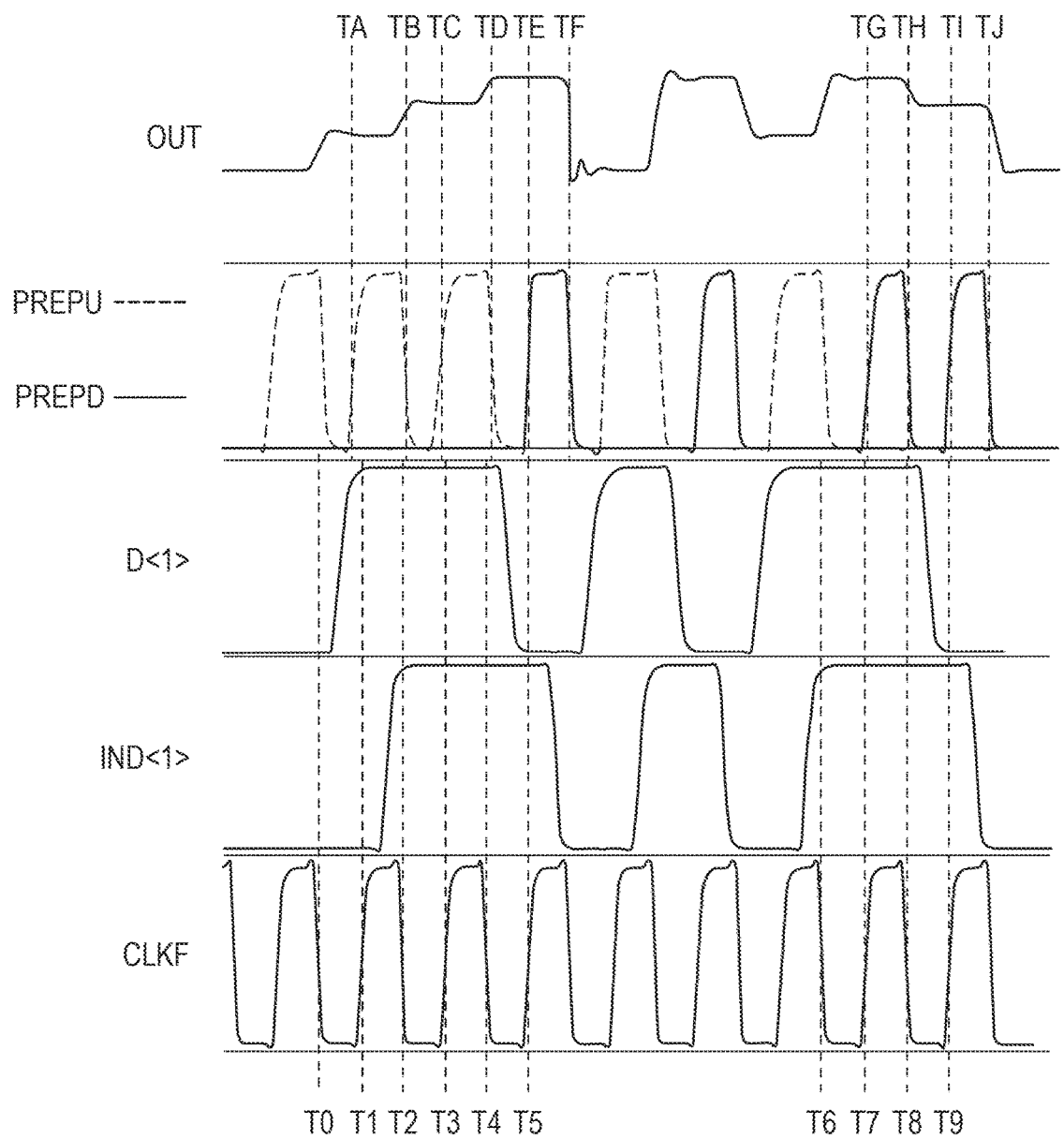
FIG. 10 is a timing diagram showing various signals during operation of signal driver according to an embodiment of the disclosure.

FIG. 10 is a timing diagram showing various signals during operation of signal driver 300 with the input circuit 600 and pull-up and pull-down logic circuits 900 and 950 according to an embodiment of the disclosure. In the present example, the IND<1> signal is provided to the first driver section 320 instead of the IN<1> bitstream and the IND<0> signal is provided to the second driver section 330 instead of the IN<0> bitstream. The PREPU and PREPD signals are provided to the boost circuit 346 instead of the BoostHi and BoostLo signals. In the example of FIG. 10, the output is terminated to a high supply voltage, resulting in "11" data represented by 1.2 V, "10" data represented by 1.0 V, "01" data represented by 0.8 V, and "00" data represented by 0.6 V. For the OUT signal shown in FIG. 10 additional pull-up drive is provided for all rising transitions via PREPU control signal and additional pull-down drive is provided for all falling transitions via PREPD control signal. Other embodiments of the disclosure may use other voltage levels to represent the data values.

At time T0 the D flip-flops 610 and 640 of the input circuit 600 are clocked by a rising edge of the CLK signal (shown in FIG. 10 as corresponding to a falling edge of the CLKF signal) and the data of the IN<1> and IN<0> bitstreams is latched to provide the D<1> and D<0> signals. In the present example, the previous data prior to time T0 is "01" and the current data at time T0 is "10". Latching of the current data "10" results in the D flip-flop 610 providing a high logic level D<1> signal and the D flip-flop 640 providing a low logic level D<0> signal (not shown in FIG. 10) shortly after time T0. With reference to the pull-up logic circuit 900, the INDF<1> is at a high logic level and the INDF<0> signal is at a low logic level based on the previous data due to the D flip-flops 620 and 660 of the input circuit not yet clocked by a rising edge of the CLKF signal. As a result, the NAND logic circuit 940 provides an active PREPU signal at time TA. The active PREPU signal activates the pull-up transistor of the boost circuit 346 to provide additional drive to pull up the common node in providing the OUT signal. As previously described, the boost circuit 346 is activated to assist with driving the common node to a higher voltage when the data of the IN<1> and IN<0> bitstreams changes from a previous data to a current data that is represented by a higher voltage than the previous data, such as in the present example where the previous data was "01" and the current data is "10".

At time T1, the D flip-flops 620 and 660 of the input circuit 600 are clocked by a rising edge of the CLKF signal (corresponding to a falling edge of the CLK signal). The high logic level of the D<1> signal is latched by the D flip-flop 620 to provide a high logic level IND<1> signal (also resulting in a low logic level INDF<1> signal) and the low logic level of the D<0> signal is latched by the D flip-flop 660 to provide a low logic level IND<0> signal (not shown in FIG. 10, also resulting in a high logic level INDF<0> signal) shortly after time T1. The IND<1> and IND<0> signals are provided to the signal driver 300 to cause the pull-up transistors of the first driver section 320 to be activated and to cause the pull-down transistors of the second driver section 330 to be activated, along with the activated pull-up transistor of the boost circuit 346 that provides additional drive to the common node. As a result, an OUT signal is provided having an intermediate-high voltage (corresponding to output data of "10") at time TB. After the INDF<1> and INDF<0> signals propagate through the NAND logic circuits 910, 920, 930, and 940 of the pull-up logic circuit 900, the PREPU signal changes to inactive. The change of the PREPU signal to inactive deactivates the pull-up transistor of the boost circuit 346. Thus, when the current data is represented by a higher voltage than the previous data, the boost circuit 346 provides additional drive to pull up the common node for a portion of the data period of the OUT signal, for example, during the transition of the OUT signal to a higher voltage. The voltage of the OUT signal changes during the transition from one voltage level to another.

At time T2 the D flip-flops 610 and 640 of the input circuit 600 are clocked by a rising edge of the CLK signal and the data of the IN<1> and IN<0> bitstreams is latched to provide the D<1> and D<0> signals. In the present example, the previous data prior to time T2 is "10" and the current data at time T2 is "11". Latching of the current data "11" results in the D flip-flop 610 providing a high logic level D<1> signal and the D flip-flop 640 providing a high logic level D<0> signal (not shown in FIG. 10) shortly after time T2. The INDF<1> is at a low logic level and the INDF<0> signal is at a high logic level based on the previous data due to the D flip-flops 620 and 660 of the input circuit not yet clocked by a rising edge of the CLKF signal. As a result, the NAND logic circuit 940 provides an active PREPU signal at time TC to activate the pull-up transistor of the boost circuit 346 and provide additional drive to pull up the common node in providing the OUT signal. The activated boost circuit 346 assists with driving the common node to a higher voltage of the current data "11" from the voltage of the previous data "10".

At time T3, the D flip-flops 620 and 660 of the input circuit 600 are clocked by a rising edge of the CLKF signal. The high logic level of the D<1> signal is latched by the D flip-flop 620 to provide a high logic level IND<1> signal (also resulting in a low logic level INDF<1> signal) and the high logic level of the D<0> signal is latched by the D flip-flop 660 to provide a high logic level IND<0> signal (not shown in FIG. 10, also resulting in a low logic level INDF<0> signal) shortly after time T3. The IND<1> and IND<0> signals are provided to the signal driver 300 to cause the pull-up transistors of the first and second driver sections 320 and 330 to be activated, along with the activated pull-up transistor of the boost circuit 346 that provides additional drive to the common node. As a result, an OUT signal is provided having the high supply voltage (corresponding to output data of "11") at time TD. After the INDF<1> and INDF<0> signals propagate through the NAND logic circuits 910, 920, 930, and 940 of the pull-up logic circuit 900, the PREPU signal changes to inactive to deactivate the pull-up transistor of the boost circuit 346 after providing additional drive to pull up the common node during the transition of the OUT signal to a higher voltage. The voltage of the OUT signal changes during the transition from one voltage level to another.

At time T4 the D flip-flops 610 and 640 of the input circuit 600 are clocked by a rising edge of the CLK signal and the data of the IN<1> and IN<0> bitstreams is latched to provide the D<1> and D<0> signals. In the present example, the previous data prior to time T4 is "11" and the current data at time T4 is "00". Latching of the current data "00" results in the D flip-flop 610 providing a low logic level D<1> signal and the D flip-flop 640 providing a low logic level D<0> signal (not shown in FIG. 10) shortly after time T4. Due to the complementary nature of the of the DDF<1> and DDF<0> signals, the DDF<1> signal is a high logic level and the DDF<0> signal is a high logic level. With reference to the pull-down logic circuit 950, the IND<1> is at a high logic level and the IND<0> signal is at a high logic level based on the previous data due to the D flip-flops 620 and 660 of the input circuit not yet clocked by a rising edge of the CLKF signal. As a result, the NAND logic circuit 990 provides an active PREPD signal at time TE to activate the pull-down transistor of the boost circuit 346 and provide additional drive to pull down the common node in providing the OUT signal. The activated boost circuit 346 assists with driving the common node to a lower voltage of the current data "00" from the voltage of the previous data "11".

At time T5, the D flip-flops 620 and 660 of the input circuit 600 are clocked by a rising edge of the CLKF signal. The low logic level of the D<1> signal is latched by the D flip-flop 620 to provide a low logic level IND<1> signal and the low logic level of the D<0> signal is latched by the D flip-flop 660 to provide a low logic level IND<0> signal (not shown in FIG. 10) shortly after time T5. The IND<1> and IND<0> signals are provided to the signal driver 300 to cause the pull-down transistors of the first and second driver sections 320 and 330 to be activated, along with the activated pull-down transistor of the boost circuit 346 that provides additional drive to the common node. As a result, an OUT signal is provided having a voltage of the low supply voltage (corresponding to output data of "00") at time TF. After the IND<1> and IND<0> signals propagate through the NAND logic circuits 960, 970, 980, and 990 of the pull-down logic circuit 950, the PREPD signal changes to inactive. The change of the PREPD signal to inactive deactivates the pull-down transistor of the boost circuit 346. Thus, when the current data is represented by a lower voltage than the previous data, the boost circuit 346 provides additional drive to pull down the common node for a portion of the data period of the OUT signal, for example, during the transition of the OUT signal to a lower voltage. The voltage of the OUT signal changes during the transition from one voltage level to another.

At time T6 the D flip-flops 610 and 640 of the input circuit 600 are clocked by a rising edge of the CLK signal and the data of the IN<1> and IN<0> bitstreams is latched to provide the D<1> and D<0> signals. In the present example, the previous data prior to time T6 is "11" and the current data at time T6 is "10". Latching of the current data "10" results in the D flip-flop 610 providing a high logic level D<1> signal and the D flip-flop 640 providing a low logic level D<0> signal (not shown in FIG. 10) shortly after time. T6. Additionally, the DDF<1> signal is a low logic level and the DDF<0> signal is a high logic level. The IND<1> is at a high logic level and the IND<0> signal is at a high logic level based on the previous data due to the D flip-flops 620 and 660 of the input circuit not yet clocked by a rising edge of the CLKF signal. As a result, the NAND logic circuit 990 provides an active PREPD signal at time TG to activate the pull-down transistor of the boost circuit 346 and provide additional drive to pull down the common node in providing the OUT signal. The activated boost circuit 346 assists with driving the common node to a lower voltage of the current data "10" from the voltage of the previous data "11".

At time T7, the D flip-flops 620 and 660 of the input circuit 600 are clocked by a rising edge of the CLKF signal. The high logic level of the D<1> signal is latched by the D flip-flop 620 to provide a high logic level IND<1> signal and the low logic level of the D<0> signal is latched by the D flip-flop 660 to provide a low logic level IND<0> signal (not shown in FIG. 10) shortly after time T7. The IND<1> and IND<0> signals are provided to the signal driver 300 to cause the pull-up transistors of the first driver section 320 to be activated and the pull-down transistors of the second driver section 330 to be activated, along with the activated pull-down transistor of the boost circuit 346 that provides additional drive to the common node. As a result, an OUT signal is provided having an intermediate-high voltage (corresponding to output data of "10") at time TH. After the IND<1> and IND<0> signals propagate through the NAND logic circuits 960, 970, 980, and 990 of the pull-down logic circuit 950, the PREPD signal changes to inactive. The change of the PREPD signal to inactive deactivates the pull-down transistor of the boost circuit 346. Thus, when the current data is represented by a lower voltage titan the previous data, the boost circuit 346 provides additional drive to pull down the common node for a portion of the data period of the OUT signal, for example, during the transition of the OUT signal to a lower voltage. The voltage of the OUT signal changes during the transition from one voltage level to another.

At time T8 the D flip-flops 610 and 640 of the input circuit 600 are clocked by a rising edge of the CLK signal and the data of the IN<1> and IN<0> bitstreams is latched to provide the D<1> and D<0> signals. In the present example, the previous data prior to time T8 is "10" and the current data at time T8 is "00". Latching of the current data "00" results in the D flip-flop 610 providing a low logic level D<1> signal and the D flip-flop 640 providing a low logic level D<0> signal (not shown in FIG. 10) shortly after time T8. Additionally, the DDF<1> signal is a high logic level and the DDF<0> signal is a high logic level. The IND<1> is at a high logic level and the IND<0> signal is at a low logic level based on the previous data due to the D flip-flops 620 and 660 of the input circuit not yet clocked by a rising edge of the CLKF signal. As a result, the NAND logic circuit 990 provides an active PREPD signal at time T1 to activate the pull-down transistor of the boost circuit 346 and provide additional drive to pull down the common node in providing the OUT signal. The activated boost circuit 346 assists with driving the common node to a lower voltage of the current data "00" from the voltage of the previous data "10".

At time T9, the D flip-flops 620 and 660 of the input circuit 600 are clocked by a rising edge of the CLKF signal. The low logic level of the D<1> signal is latched by the D flip-flop 620 to provide a low logic level IND<1> signal and the low level of the D<0> signal is latched by the D flip-flop 660 to provide a low logic level IND<0> signal (not shown in FIG. 10) shortly after time T9. The IND<1> and IND<0> signals are provided to the signal driver 300 to cause the pull-down transistors of the first and, second driver sections 320 and 330 to be activated, along with the activated pull-down transistor of the boost circuit 346 that provides additional drive to the common node. As a result, an OUT signal is provided having a voltage of the low supply voltage (corresponding to output data of "00") at time TJ. After the IND<1> and IND<0> signals propagate through the NAND logic circuits 960, 970, 980, and 990 of the pull-down logic circuit 950, the PREPD signal changes to inactive. The change of the PREPD signal to inactive deactivates the pull-down transistor of the boost circuit 346. Thus, when the current data is represented by a lower voltage than the previous data, the boost circuit 346 provides additional drive to pull down the common node for a portion of the data period of the OUT signal, for example, during the transition of the OUT signal to a lower voltage. The voltage of the OUT signal changes during the transition from one voltage level to another.

In summary:
Prior to time T(0) the D<1:0> signals start at "01", resulting in the IND<1:0> signals being at "01".
The D<1:0> signals become "10" following the T0 rising CLK edge (corresponding to a falling CLKF edge). The PREPU signal becomes a "1". The OUT signal transitions from "01" to "10", and benefits from additional pull-up drive. The IND<1:0> signals become "10" after the T1 falling CLK edge (corresponding to a rising CLKF edge). The PREPU signal becomes "0". The additional pull-up drive is terminated after one-half of the clock period of the CLK signal.
The D<1:0> signals become "11" following the T2 rising CLK edge. The PREPU signal becomes a "1". The OUT signal transitions from "10" to "11", and benefits from additional pull-up drive. The IND<1:0> signals become "11" after the T3 falling CLK edge. The PREPU signal becomes "0". The additional pull-up drive is terminated after one-half of the clock period of the CLK signal.
The D<1:0> signals become "00" following the T4 rising CLK edge. The PREPD signal becomes a "1". The OUT signal transitions from "11" to "00", and benefits from additional pull-down drive. The IND<1:0> signals become "00" following the T5 falling CLK edge. The PREPD signal becomes "0". The additional pull-down drive is terminated after one-half of the clock period of the CLK signal.
The D<1:0> signals become "10" following the T6 rising CLK edge. The PREPD signal becomes a "1". The OUT signal transitions from "11" to "10", and benefits from additional pull-down drive. The IND<1:0> signals become "10" following the T7 falling CLK edge. The PREPD signal becomes a "0". The additional pull-down drive is terminated after one-half of the clock period of the CLK signal.
The D<1:0> signals become "00" following the T8 rising CLK edge. The PREPD signal becomes a "1". The OUT signal transitions from "10" to "00", and benefits from additional pull-down drive. The IND<1:0> signals become "00" following the T9 falling CLK edge. The PREPD signal becomes a "0". The additional pull-down drive is terminated after one-half of the clock period of the CLK signal.

As illustrated by the previous example of FIG. 10, the D<1> and D<0> signals are updated after the rising edges of the CLK signal (corresponding to the falling edges of the CLKF signal). The IND<1> and IND<0> signals are updated after the falling edges of the CLK signal (corresponding to the rising edges of the CLKF signal). The PREPU, PREPD signals may be asserted after the rising edges of the CLK signal and reset after the falling edges of the CLK signal. The OUT signal is updated after D<1> and D<0> signals settle. For example, the D<1> and D<0> signals are updated after the rising edges of the CLK signal plus some more propagation delay.

In some embodiments of the disclosure, PAM8 is used to convert three bitstreams (e.g., IN<2>, IN<1>, and IN<0> bitstreams) into an OUT output signal having one of eight different voltage levels.

Figure 11:
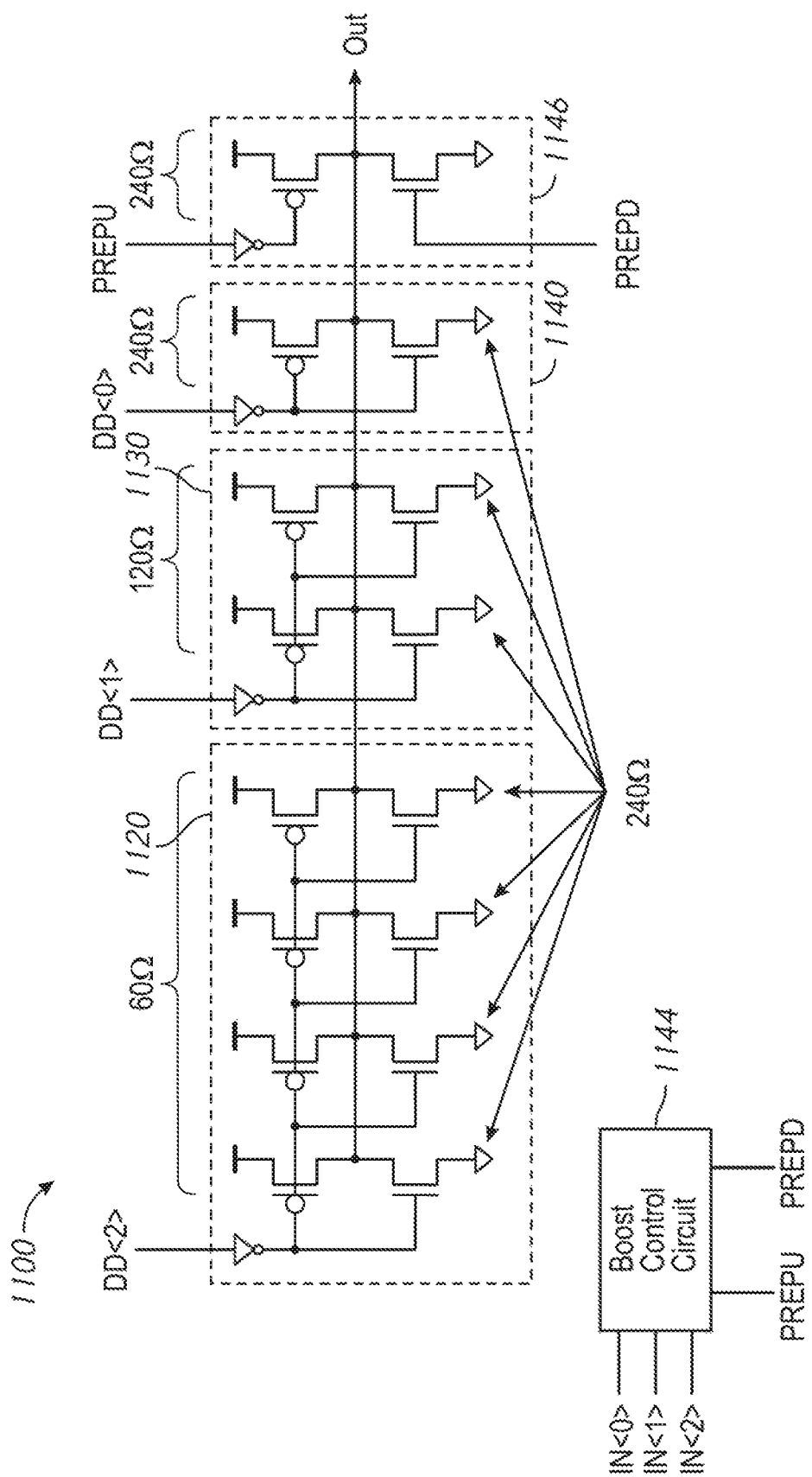
FIG. 11 is a schematic diagram of a signal driver according to an embodiment of the disclosure.

FIG. 11 is a schematic diagram of a signal driver 1100 according to an embodiment of the disclosure. The signal driver 1100 may be used for a multilevel signal architecture implementing PAM8 encoding. The driver circuit 1100 may be included in the driver circuit 215 of FIG. 2B in embodiments of the disclosure. The signal driver 1100 includes a driver circuit including seven line drivers coupled to a common node that is an output. Each of the signal line drivers are coupled to a high supply voltage (e.g., VDDQ) and to a low supply voltage (e.g., VSSQ). The signal driver 1100 may be a driver in a DRAM, such as a double data rate (DDR) DRAM driver. In some embodiments of the disclosure, each of the signal line drivers has an impedance of 240 ohms.

The driver circuit 1100 may include a first driver section 1120, a second driver section 1130, and a third driver section 1140 configured to drive an output signal OUT to a common node to which the first, second, and third driver sections 1120, 1130, and 1140 are coupled. A signal line may be coupled to the common node. The output signal OUT may be driven by the first, second, and third driver sections 1120, 1130, and 1140 based on IN<2>, IN<1>, and IN<0> bitstreams. As will be described in more detail below, signals DD<2>, DD<1>, and DD<0>, which are based on the IN<2>, IN<1>, and IN<0> bitstreams, respectively, may be provided to the signal line drivers of the driver circuit 1100. The output signal OUT may be a multilevel signal representing data of the IN<2>, IN<1>, and IN<0> bitstreams that drives the I/O bus. In some embodiments of the disclosure, "1" data is represented by the IN<2> signal, IN<1> signal, or IN<0> signal having a voltage of 1.2 V, and "0" data is represented by the IN<2>, IN<1> signal, or IN<0> signal having a voltage of 0 V. However, other voltage levels may be used to represent the "1" and "0" data in other embodiments of the disclosure.

The first driver section 1120 may include four signal line drivers coupled to the common node, each controlled responsive to the DD<2> signal. Each signal line driver may include a pull-up (e.g., p-type) transistor and a pull-down (e.g., n-type) transistor. The second driver section 1130 may include two signal line drivers coupled to the common node, each controlled responsive to the DD<1> signal, and each signal line driver may include a pull-up (e.g., p-type) transistor and a pull-down (e.g., n-type) transistor. The third driver section 1130 may include one signal line driver coupled to the common node and controlled responsive to the DD<0> signal. The signal line driver of the third driver section 1130 may include a pull-up (e.g., p-type) transistor and a pull-down (e.g., n-type) transistor. In an embodiment of the disclosure, where each signal line driver has an impedance of 240 ohms, the first driver section 1120 has an effective impedance of 60 ohms, the second driver section 1130 has an effective impedance of 120 ohms, and the third driver section 1140 has an effective impedance of 240 ohms.

The signal driver 1100 further includes a boost circuit 346 that receives control signals PREPU and PREPD from boost control circuit 1144. The boost control circuit 1144 includes logic circuits and provides control signals PREPU and PREPD to the signal driver 1100 based on the IN<2>, IN<1>, and IN<0> bitstreams. The boost circuit 1146 is coupled to the common node and includes a pull-up (e.g., p-type) transistor and a pull-down (e.g., n-type) transistor, which are controlled by the PREPU and PREPD signals, respectively. In the embodiment of FIG. 11, the PREPU signal is active when at a high logic level to activate the pull-up transistor and the PREPD signal is active when at a high logic level to activate the pull-down transistor. When activated by an active PREPU signal from the boost control circuit 1144, the pull-up transistor provides additional drive to pull up the level of the signal line. Similarly, when activated by an active PREPD signal from the boost control circuit 1144, the pull-down transistor provides additional drive to pull down the level of the signal line. In some embodiments of the disclosure, a PREPU signal or PREPD signal having the high logic level is represented by a signal of 1.2 V, and a PREPU signal or PREPD signal having the low logic level is represented by a signal of 0 V. However, other voltage levels may be used to represent the "1" and "0" data in other embodiments of the disclosure.

As will be described in more detail below, the pull-up transistor of the boost circuit 346 may be activated when the IN<0>, IN<1>, and IN<0> bitstreams represent data corresponding to a voltage level of a high supply voltage (e.g., representing data "111"), and the pull-down transistor may be activated when the IN<2>, IN<1>, and IN<0> bitstreams represent data corresponding to a voltage level of a low supply voltage (e.g., representing data "000"). While FIG. 11 shows the boost circuit 1146 as including one pull-up transistor and one pull-down transistor, in other embodiments of the disclosure, the boost circuit 1146 may include a greater number of pull-up and/or pull-down transistors. Thus, the embodiment of FIG. 11 is not intended to limit boost circuits, or more generally, driver circuits, to embodiments of the disclosure having the specific configuration shown in FIG. 11.

In operation, the signal driver 1100 may drive the OUT signal responsive to the IN<2>, IN<1>, and IN<0> bitstreams. The DD<2>, DD<1>, DD<0> signals, which are based on the IN<2>, IN<1>, and IN<0> bitstreams, are provided to the signal line drivers of the driver sections 1120, 1130, and 1140 to provide an output signal OUT having appropriate voltage for the multilevel signal, for example, using PAM to convert a plurality of bitstreams into a multilevel signal.

In some embodiments of the disclosure, PAM8 is used to convert three bitstreams (e.g., the IN<2>, IN<0>, and IN<0> bitstreams) into an OUT signal having one of eight different voltage levels. By way of the DD<2> signal, the IN<2> bitstream may be provided to the signal line drivers of the first driver section 1120; by way of the DD<1> signal, the IN<1> bitstream may be provided to the signal line drivers of the second driver section 1130; and by way of the DD<2> signal, the IN<0> bitstream may be provided to the signal line drivers of the third driver section 1140. The resulting output signal will have one of eight different voltages corresponding to the data of the IN<2>, IN<1>, and IN<0> bitstreams.

For example, where a current data of the IN<2>, IN<1>, and IN<0> bitstreams is a "000", the pull-down transistors of the driver sections 1120, 1130, and 1140 are activated to pull down the common node to the low supply voltage to provide an output signal OUT having the voltage of the low supply voltage. Where a current data of the IN<2>, IN<1>, and IN<0> bitstream is a "111", the pull-up transistors of the driver sections 1120, 1130, and 1140 are activated to pull up the common node to the high supply voltage to provide an output signal OUT having the voltage of the high supply voltage. The six other data represented by the three bits may have intermediate voltages between the high and low supply voltages.

The first driver section 1120, the second driver section 1130, the third driver section 1140, and the boost circuit 1146 are shown in FIG. 11 as including p-type pull-up transistors and n-type pull-down transistors. That is, the pull-up and pull-down transistors have different conductivity types. In other embodiments of the disclosure, the first driver section 1120, the second driver section 1130, and the boost circuit 1146 may include n-type pull-up transistors, or a combination of p-type and n-type pull-up transistors. In embodiments of the disclosure using n-type pull-up transistors, which are activated by a high logic level signal (e.g., having the high supply voltage), the logic level of the signals provided to gates of the n-type pull-up transistors will have a complementary logic level to signals provided to the gates of p-type pull-up transistors. A signal having a complementary logic level may be provided by using an inverter circuit.

Figure 12:
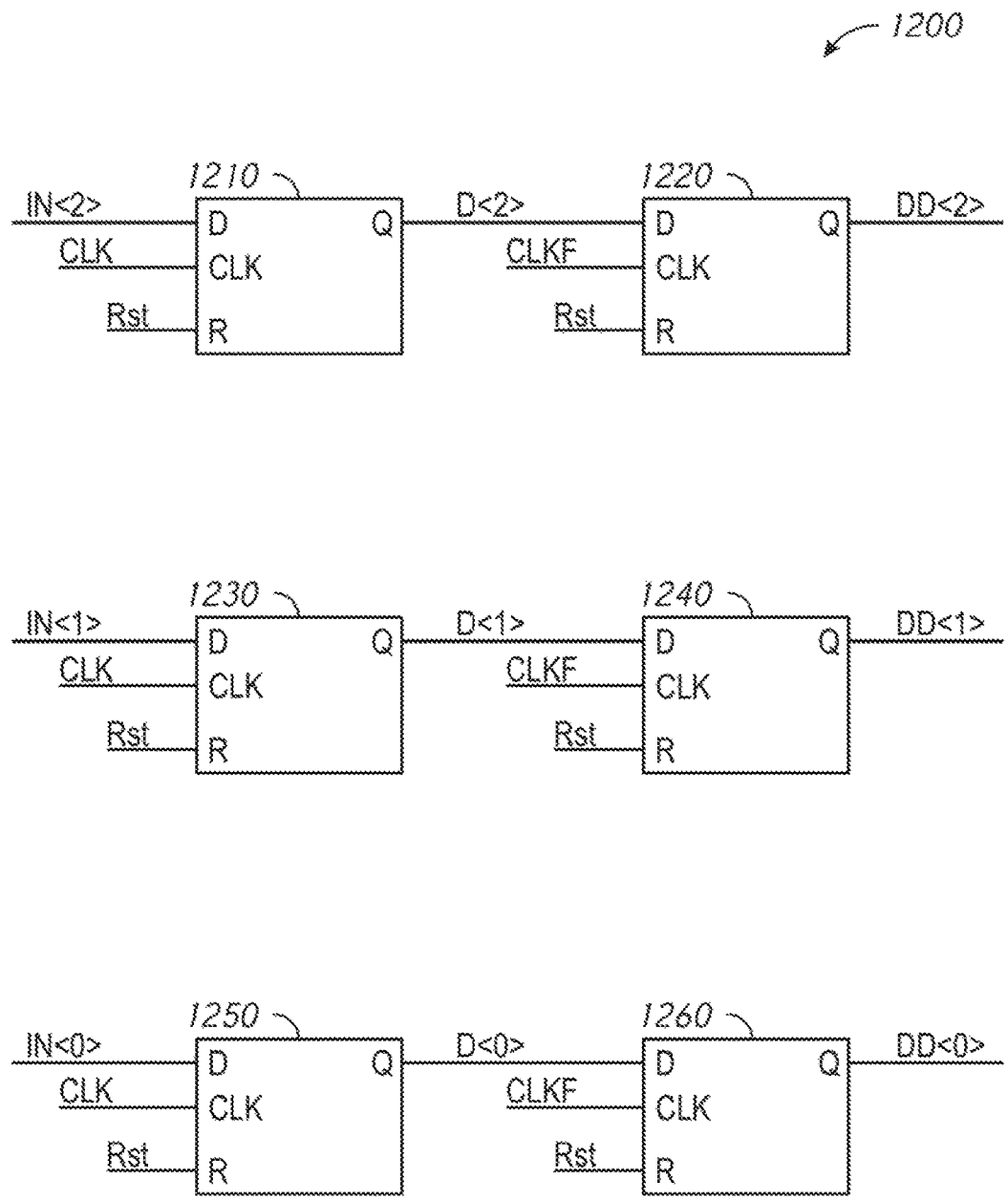
FIG. 12 is a schematic diagram of an input circuit for a boost control circuit according to embodiment of the disclosure.

FIG. 12 is a schematic diagram of an input circuit 1200 according to an embodiment of the disclosure. The input circuit 1200 may be included in the input circuit 243 of FIG. 2B for some embodiments of the disclosure. The input circuit 1200 includes D flip-flop circuits 1210 and 1220, D flip-flop circuits 1230 and 1240, and D flip-flop circuits 1250 and 1260. The D flip-flop circuit 1210 receives the IN<2> bitstream, the D flip-flop circuit 1230 receives the IN<1> bitstream and the D flip-flop circuit 1250 receives the IN<0> bitstream. The D flip-flop circuits 1210, 1230, and 1250 are clocked by a clock signal CLK. The D flip-flop circuits 1220, 1240, and 1260 are clocked by a clock signal CLKF, which is the complement to the CLK signal. The D flip-flop circuits 1210, 1220, 1230, 1240, 1250, and 1260 may be reset to provide an output having a known logic level when an active reset signal RST is provided to the D flip-flop circuits. The D flip-flop circuits 1210, 1220, 1230, 1240, 1250, and 1260 may be reset, for example, upon reset of the semiconductor device, as part of a power up sequence, etc.

In operation, the D flip-flop circuit 1210 latches a current logic level of the IN<2> bitstream responsive to a rising edge of the CLK signal and provides an output signal D<2> having the same logic level as the latched logic level. The D flip-flop circuit 1220 latches the logic level of the D<2> signal responsive to a rising edge of the CLKF signal and provides an output signal DD<2> having the same logic level as the latched logic level. The D flip-flop circuit 1230 latches a current logic level of the IN<1> bitstream responsive to a rising edge of the CLK signal and provides an output signal D<1> having the same logic level as the latched logic level. The D flip-flop circuit 1240 latches the logic level of the D<1> signal responsive to a rising edge of the CLKF signal and provides an output signal DD<1> having the same logic level as the latched logic level. Likewise, the D flip-flop circuit 1250 latches a current logic level of the IN<0> bitstream responsive to a rising edge of the CLK signal and provides an output signal D<0> having the same logic level as the latched logic level. The D flip-flop circuit 1260 latches the logic level of the D<0> signal responsive to a rising edge of the CLKF signal and provides an output signal DD<0> having the same logic level as the latched logic level. As previously described, the DD<2>, DD<1>, and DD<0> signals, which are based on the IN<2>, IN<1>, and INS bitstreams, are provided to the driver sections 1120, 1130, and 1140, all respectively, of the signal driver 1100.

With reference to the CLK signal, the IN<2>, IN<1>, and IN<0> bitstreams are latched and the D<2>, D<1>, and D<0> signals provided responsive to a rising edge of the CLK signal, and the D<2>, D<1>, and D<0> signals are latched and the DD<2>, DD<1>, and DD<0> signals are provided responsive to a falling edge of the CLK signal (i.e., the rising edge of the CLKF signal). Thus, the DD<2>, DD<1>, and DD<0> signals have the logic levels of the D<2>, D<1>, and D<0> signals delayed by one-half a clock period of the CLK signal.

Figure 13A:
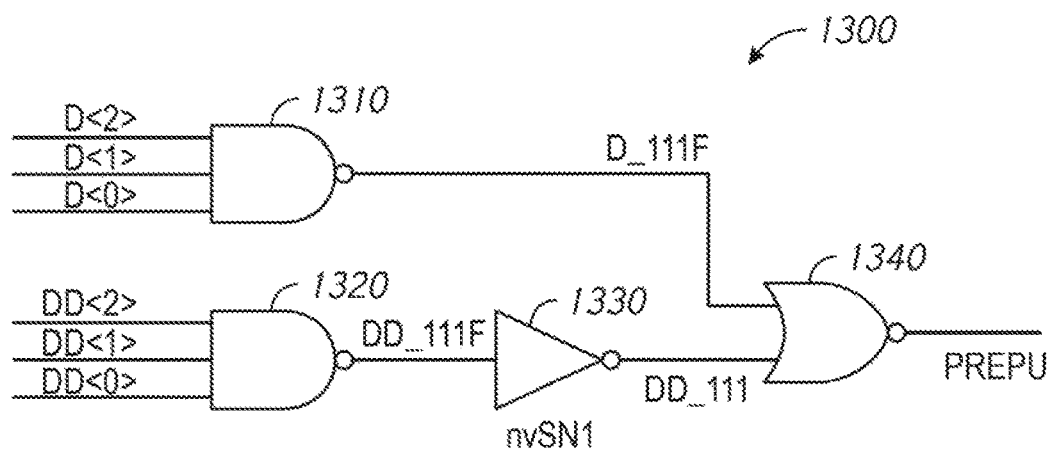
FIG. 13A is a schematic diagram of a pull-up logic circuit for a boost control circuit according to an embodiment of the disclosure.

FIG. 13A is a schematic diagram of a pull-up logic circuit 1300 according to an embodiment of the disclosure. The pull-up logic circuit 1300 may be included in the boost control circuit 245 of FIG. 2B in some embodiments of the disclosure. The pull-up logic circuit 1300 includes a NAND logic circuit 1310 that receives the D<2>, D<1>, and D<0> signals, for example, from the input circuit 1200, and provides an output signal D_111F that results from a NAND logic operation of the D<2>, D<1>, and D<0> signals. The pull-up logic circuit 1300 further includes a NAND logic circuit 1320 that receives the DD<2>, DD<1>, and DD<0> signals, for example from the input circuit 1200. The NAND logic circuit 1320 provides an output signal DD_111F resulting from a NAND logic operation on the DD<2>, DD<1>, and DD<0> signals to an inverter circuit 1330. The inverter circuit 1330 provides an output signal DD_111 that is the complement of the DD_111F signal. A NOR logic circuit receives the D_111F signal from the NAND logic circuit 1310 and the DD_111 signal from the inverter circuit 1330 and provides an output signal PREPU that results from a NOR logic operation.

In operation, the logic circuit 1300 provides an active PREPU signal (e.g., active high logic level) when the data of the IN<2>, IN<1>, and IN<0> bitstreams changes from a previous value to a current data of "111". That is, where the previous data represented by the IN<2>, IN<1>, and IN<0> bitstreams is "000", "001", "010", "011", "100", "101", or "110", and the data changes to a current data of "111", the logic circuit 1300 provides an active PREPU signal. The logic circuit 1300 provides an inactive PREPU signal for other changes from a previous data to a current data represented by the IN<2>, IN<1>, and IN<0> bitstreams. That is, the logic circuit 1300 provides an inactive PREPU signal for the IN<2>, IN<1>, and IN<0> bitstreams changing from a previous data to current data of "000", "001", "010", "011", "100", "101", or "110". The active PREPU signal provided by the logic circuit 1300 may be used to activate a boost circuit, for example, the boost circuit 1146 of the signal driver 1100, to provide additional drive to assist driving the common node to the high supply voltage to provide an OUT signal having a voltage of the high supply voltage. The PREPU signal is active for a portion of the data period of the OUT signal. For example, in some embodiments of the disclosure, the PREPU signal is limited to being active to assist the driving of the common node to the high supply voltage.

The NAND logic circuit 1310 provides a low logic level D_111F signal when D<2>, D<1>, and D<0> are all a high logic level (i.e., resulting from the IN<2>, IN<1>, and IN<0> bitstreams representing a current data of "111"). The inverter circuit 1330 coupled to the NAND logic circuit 1320 provides a low logic level DD_111 when DD<2>, DD<1>, and DD<0> signals are all a high logic level (i.e., resulting from D<2>, D<1>, and D<0> all a high logic level). Recall that the DD<2>, DD<1>, and DD<0> signals are delayed relative to the D<2>, D<1>, and D<0> signals, for example, by one-half a clock period of the CLK signal. The NOR logic gate 1340 provides an active PREPU signal (e.g. active high logic level) when the D_111F and DD_111 signals have low logic levels. As a result, the PREPU signal is active when the D<2>, D<1>, and D<0> signals are at a high logic level, and for one-half a clock cycle of the CLK signal following a rising edge of the CLK signal. The PREPU signal is active for one-half a clock cycle of the CLK signal because the one-half clock cycle delay of the DD<2>, DD<1>, and DD<0> signals relative to the D<2>, D<1>, and D<0> signals will result in the DD_111 signal being at a low logic level while the D_111F signal is at a low logic level (from D<2>, D<1>, and D<0> being a high logic level), but for one-half a clock cycle of the CLK signal before DD<2>, DD<1>, and DD<0> also become a high logic level (resulting from the D<2>, D<1>, and D<0> signals being at the high logic level). As a result, the PREPU signal is active for one-half a clock cycle of the CLK signal.

Figure 13B:
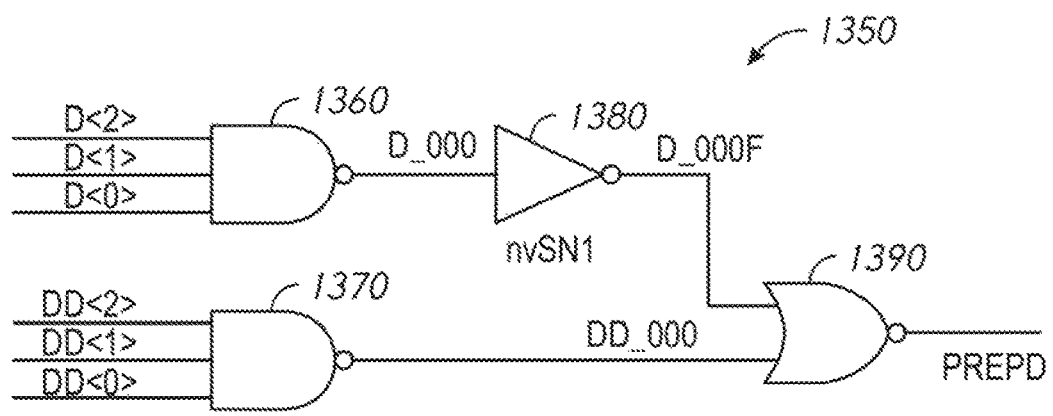
FIG. 13B is a schematic diagram of a pull-down logic circuit for a boost control circuit according to an embodiment of the disclosure.

FIG. 13B is a schematic diagram of a pull-down logic circuit 1350 according to an embodiment of the disclosure. The pull-down logic circuit 1350 may be included in the boost control circuit 245 of FIG. 2B in some embodiments of the disclosure. The pull-down logic circuit 1350 includes a NOR logic circuit 1360 that receives the D<2>, D<1>, and D<0> signals, for example, from the input circuit 1200, and provides an output signal D_000 that results from a NOR logic operation of the D<2>, D<1>, and D<0> signals. The D_000 signal is provided to an inverter circuit 1380. The inverter circuit 1380 provides an output signal D_000F that is the complement of the D_000 signal. The pull-down logic circuit 1350 further includes a NOR logic circuit 1370 that receives the DD<2>, DD<1>, and DD<0> signals, for example from the input circuit 1200, and provides an output signal DD_000 resulting from a NOR logic operation on the DD<2>, DD<1>, and DD<0> signals. A NOR logic circuit 1390 receives the D_000F signal from the inverter circuit 1380 and the DD_000 signal from the NOR logic circuit 1370 and provides an output signal PREPD that resulting from a NOR logic operation.

In operation, the logic circuit 1350 provides an active PREPD signal (e.g., active high logic level) when the data of the IN<2>, IN<1>, and IN<0> bitstreams changes from a previous value to a current data of "000". That is, where the previous data represented by the IN<2>, IN<1>, and IN<0> bitstreams is "001", "010", "011", "100", "101", "110", or "111", and the data changes to a current data of "000", the logic circuit 1350 provides an active PREPD signal. The logic circuit 1350 provides an inactive PREPD signal for other changes from a previous data to a current data represented by the IN<2>, IN<1>, and IN<0> bitstreams. That is, the logic circuit 1350 provides an inactive PREPD signal for the IN<2>, IN<1>, and IN<0> bitstreams changing from a previous data to current data of "001", "010", "011", "100", "101", "110", or "111". The active PREPD signal provided by the logic circuit 1350 may be used to activate a boost circuit, for example, the boost circuit 1146 of the signal driver 1100, to provide additional drive to assist driving the common node to the low supply voltage to provide an OUT signal having a voltage of the low supply voltage. As will be described in more detail below, the PREPD signal is active for a portion of the data period of the OUT signal. For example, in some embodiments of the disclosure, the PREPD signal is limited to being active to assist the driving of the common node to the low supply voltage.

The inverter circuit 1380 coupled to the NOR logic circuit 1360 provides a low logic level D_000F signal when D<2>, D<1>, and D<0> are all a low logic level (i.e., resulting from the IN<2>, IN<1>, and IN<0> bitstreams representing a current data of "000"). The NOR logic circuit 1370 provides a high logic level DD_000 signal when DD<2>, DD<1>, and DD<0> are all a low logic level (i.e., resulting from D<2>, D<1>, and D<0> all a low logic level). Recall that the DD<2>, DD<1>, and DD<0> signals are delayed relative to the D<2>, D<1>, and D<0> signals, for example, by one-half a clock period of the CLK signal. The NOR logic gate 1390 provides an active PREPD signal (e.g. active high logic level) when the D_000F and DD_000 signals have low logic levels. As a result, the PREPD signal is active when D<2>, D<1>, and D<0> are at a low logic level, and for one-half a clock cycle of the CLK signal following a rising edge of the CLK signal. The PREPD signal is active for one-half a clock cycle of the CLK signal because the one-half clock cycle delay of the DD<2>, DD<1>, and DD<0> relative to D<2>, D<1>, and D<0> will result in the DD_000 signal being at a low logic level while the D_000F signal is at a low logic level (from D<2>, D<1>, and D<0> being a low logic level), but for one-half a clock cycle of the CLK signal before the DD<2>, DD<1>, and DD<0> signals also become a low logic level (resulting from the D<2>, D<1>, and D<0> signals being at the low logic level) and the NOR logic circuit 1370 provides a high logic level DD_000. As a result, the PREPD signal is active for one-half a clock cycle of the CLK signal.

Figure 14:
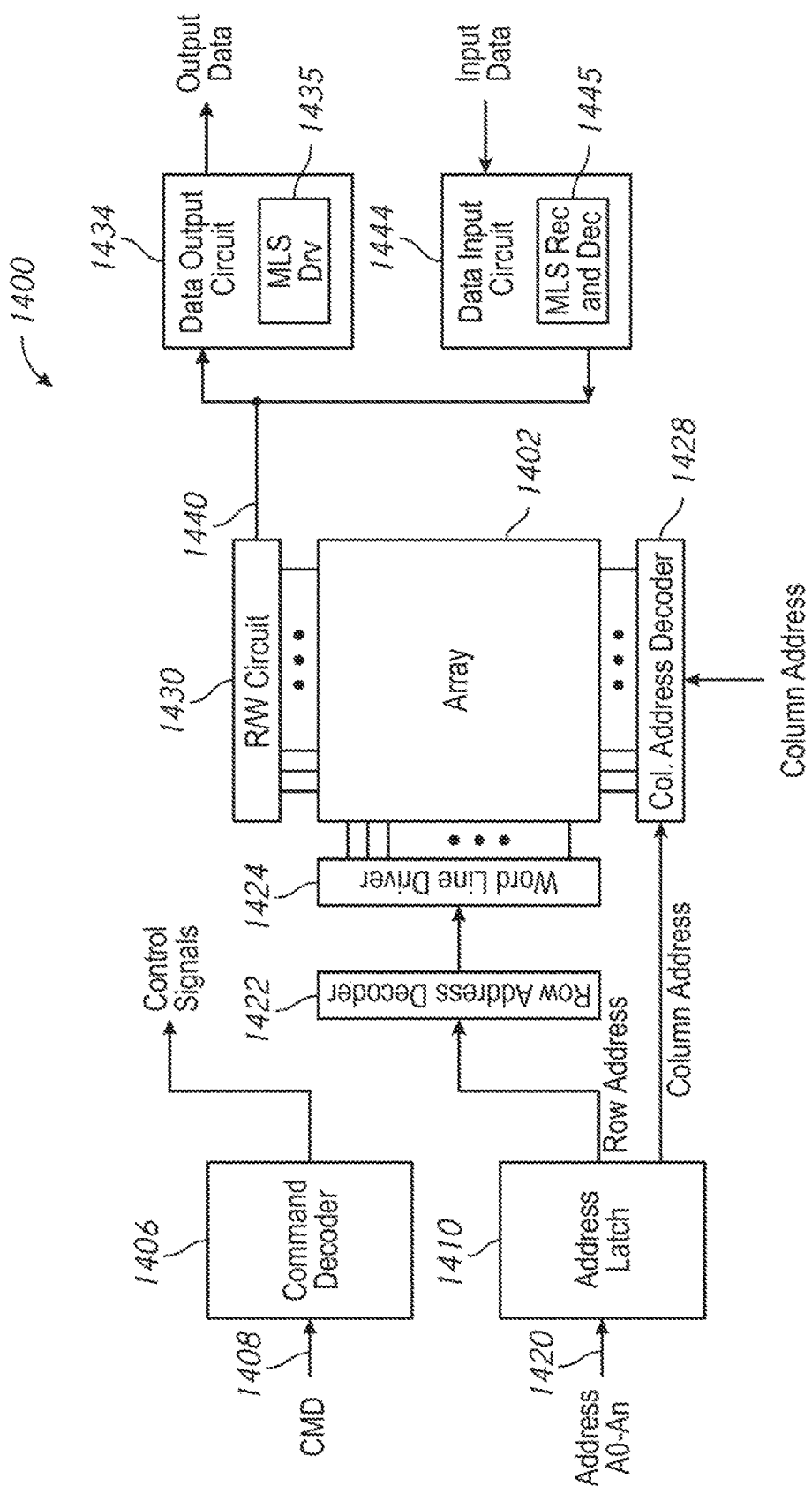
FIG. 14 illustrates a portion of a memory according to an embodiment of the disclosure.

FIG. 14 illustrates a portion of a memory 1400 according to an embodiment of the present disclosure. The memory 1400 includes an array 1402 of memory cells, which may be, for example, volatile memory cells, non-volatile memory cells, DRAM memory cells, SRAM memory cells, flash memory cells, or some other types of memory cells. The memory 1400 includes a command decoder 1406 that receives memory commands through a command bus 1408. The command decoder 1406 responds to memory commands received through the memory bus 1408 to perform various operations on the array 1402. For example, the command decoder 1406 provides control signals to read data from and write data to the array 1402 for read commands and write commands.

The memory 1400 further includes an address latch 1410 that receives memory addresses through an address bus 1420, for example, row and column addresses. The address latch 1410 then outputs separate column addresses and separate row addresses. The row and column addresses are provided by the address latch 1410 to a row address decoder 1422 and a column address decoder 1428, respectively. The column address decoder 1428 selects bit lines extending through the array 1402 corresponding to respective column addresses. The row address decoder 1422 is connected to word line driver 1424 that activates respective rows of memory cells in the array 1402 corresponding to received row addresses.

The selected data line (e.g., a bit line or bit lines) corresponding to a received column address are coupled to a read/write circuitry 1430 to provide read data to a data output circuit 1434 via an input-output data bus 1440. The data output circuit 1434 may include multilevel signal drivers 1435 that are configured to drive multilevel voltages on signal lines of an output data bus. The multilevel signal drivers 1435 may include signal drivers according to embodiments of the disclosure, including for example, the signal drivers and circuits previously shown and described, or combinations thereof. Write data to be written to the array 1402 are received by the data input circuit 1444 and provided over the input-output data bus 1440 to the read/write circuitry 1430. The data is then written to the array 1402 in the memory cells corresponding to the row and column addresses of the write command.

From the foregoing it will be appreciated that, although specific embodiments of the disclosure have been described herein for purposes of illustration, various modifications may be made without deviating from the spirit and scope of the disclosure. Accordingly, the scope disclosure should not be limited any of the specific embodiments described herein.

What is claimed is:

1. An apparatus, comprising:
   a driver circuit configured to receive a plurality of input signals, and further configured to provide an output signal at a node responsive to the plurality of input signals, each of the plurality of input signals having a respective logic level, the output signal having a voltage representing the logic levels of the plurality of input signals;
   a boost circuit including a transistor coupled to the node and a supply voltage, when activated the boost circuit configured to provide additional drive to change the voltage of the node; and
   a boost control circuit configured to provide a signal to activate the boost circuit based on the logic levels of the plurality of input signals,
   wherein the transistor of the boost circuit comprises a pull-up transistor and the supply voltage is a high supply voltage, and wherein the boost control circuit is configured to provide the signal to activate the boost circuit responsive to the driver circuit providing an output signal having a voltage indicative of the plurality of input signals having high logic levels.

2. An apparatus, comprising:
   a driver circuit configured to receive a plurality of input signals, and further configured to provide an output signal at a node responsive to the plurality of input signals, each of the plurality of input signals having a respective logic level, the output signal having a voltage representing the logic levels of the plurality of input signals;
   a boost circuit including a transistor coupled to the node and a supply voltage, when activated the boost circuit configured to provide additional drive to change the voltage of the node; and
   a boost control circuit configured to provide a signal to activate the boost circuit based on the logic levels of the plurality of input signals,
   wherein the transistor of the boost circuit is a pull-down transistor and the supply voltage is a low supply voltage, and wherein the boost control circuit is configured to provide the signal to activate the boost circuit responsive to the driver circuit providing an output signal having a voltage indicative of the plurality of input signals having low logic levels.

3. The apparatus of claim 1, wherein the boost control circuit is further configured to provide the signal to activate the boost circuit responsive to the plurality of input signals changing from logic levels indicated by the output signal having a first voltage to logic levels indicated by the output signal having a second voltage greater than the first voltage.

4. The apparatus of claim 2 wherein the boost control circuit is further configured to provide the signal to activate the boost circuit responsive to the plurality of input signals changing from logic levels indicated by the output signal having a first voltage to logic levels indicated by the output signal having a second voltage less than the first voltage.

5. The apparatus of claim 1 wherein the boost circuit further includes a pull-down transistor coupled to a low supply voltage, the boost control circuit configured to activate the boost circuit to provide additional drive through the pull-up transistor to increase the voltage of the node and to provide additional drive through the pull-down transistor to decrease the voltage of the node.

6. The apparatus of claim 1 wherein the transistor comprises a p-type transistor.

7. The apparatus of claim 1 wherein the transistor comprises a n-type transistor.

8. An apparatus, comprising:
   a driver circuit configured to receive a plurality of input bitstreams, and further configured to provide at a node an output signal having a voltage indicative of a value of data represented by the plurality of input bitstreams;
   a boost circuit coupled to the node and configured to couple a supply voltage to the node when activated by an active boost signal; and
   a boost control circuit configured to provide the boost signal to activate the boost circuit responsive to the data represented by the plurality of input bitstreams changing from a first value to a second value different from the first value.

9. The apparatus of claim 8 wherein the supply voltage comprises a high supply voltage and wherein the second value of the data is indicated by the output signal having a voltage of the high supply voltage.

10. The apparatus of claim 8 wherein the supply voltage comprises a high supply voltage and wherein the second value is indicated by the output signal having a voltage that is greater than a voltage of the output signal indicative of the first value.

11. The apparatus of claim 8 wherein the supply voltage comprises a low supply voltage and wherein the second value of the data is indicated by the output signal having a voltage of the low supply voltage.

12. The apparatus of claim 8 wherein the supply voltage comprises a low supply voltage and wherein the second value is indicated by the output signal having a voltage that is less than a voltage of the output signal indicative of the first value.

13. The apparatus of claim 8 wherein the driver circuit comprises:
   a first driver section configured to be activated responsive to bit values a first bitstream of the plurality of bitstreams; and
   a second driver section configured to be activated responsive to bit values a second bitstream of the plurality of bitstreams.

14. The apparatus of claim 13 wherein the first driver section comprises a first plurality of signal line drivers and wherein the second driver section comprises a second plurality of signal line drivers, each of the signal line drivers of the first and second pluralities of signal line drivers comprising:
   a p-type transistor coupled between the node and a high supply voltage; and
   an n-type transistor coupled between the node and a low supply voltage.

15. The apparatus of claim 8 wherein the boost control circuit is configured to activate the boost circuit to provide additional drive to change the voltage of the node when a voltage of the output signal changes.

* * * * *